United States Patent
Kang et al.

(10) Patent No.: US 10,309,011 B2
(45) Date of Patent: Jun. 4, 2019

(54) METHOD FOR MANUFACTURING TWO-DIMENSIONAL TRANSITION METAL DICHALCOGEMIDE THIN FILM

(71) Applicant: KOREA RESEARCH INSTITUTE OF STANDARDS AND SCIENCE, Daejeon (KR)

(72) Inventors: Sang Woo Kang, Daejeon (KR); Ji Hun Mun, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 0 days.

(21) Appl. No.: 15/562,545

(22) PCT Filed: Jul. 28, 2016

(86) PCT No.: PCT/KR2016/008303
§ 371 (c)(1),
(2) Date: Sep. 28, 2017

(87) PCT Pub. No.: WO2017/018834
PCT Pub. Date: Feb. 2, 2017

(65) Prior Publication Data
US 2018/0105930 A1    Apr. 19, 2018

(30) Foreign Application Priority Data

Jul. 29, 2015 (KR) .................. 10-2015-0107443
Jul. 25, 2016 (KR) .................. 10-2016-0093974

(51) Int. Cl.
*C01B 17/20* (2006.01)
*C01G 39/06* (2006.01)
*C23C 16/02* (2006.01)
*C23C 16/30* (2006.01)
(Continued)

(52) U.S. Cl.
CPC ............ *C23C 16/305* (2013.01); *C01B 17/20* (2013.01); *C01G 39/06* (2013.01);
(Continued)

(58) Field of Classification Search
CPC ............ C23C 16/305; C23C 16/0227; C23C 16/45527; C23C 16/52; C23C 16/45555;
(Continued)

(56) References Cited

U.S. PATENT DOCUMENTS 9,691,611 B2 * 6/2017 Yeh .................. C23C 16/4404
427/248.1
2007/0020400 A1 * 1/2007 Chang .................. B05B 7/0408
427/421.1
(Continued)

FOREIGN PATENT DOCUMENTS

KR    10-2015-0015183 A    2/2015

OTHER PUBLICATIONS

Kumar (Kumar et al, "A predictive approach to CVD of crystalline layers of TMDs: the case of MoS2", Nanoscale 2015, 7, 7802-7810) (Year: 2015).*
(Continued)

*Primary Examiner* — Michael P Wieczorek
*Assistant Examiner* — Michael G Miller
(74) *Attorney, Agent, or Firm* — Rabin & Berdo, P.C.

(57) ABSTRACT

The present invention relates to a method for preparing a two-dimensional transition metal dichalcogenide and, more particularly, to a method for preparing a highly uniform two-dimensional transition metal dichalcogenide thin film. More specifically, the present invention is directed to a preparation method for a highly uniform two-dimensional transition metal dichalcogenide thin film at low temperature of 500° C. or below.

19 Claims, 23 Drawing Sheets

(51) Int. Cl.
    *C23C 16/52* (2006.01)
    *C30B 25/16* (2006.01)
    *C30B 25/18* (2006.01)
    *C30B 29/46* (2006.01)
    *C30B 29/64* (2006.01)
    *C23C 16/455* (2006.01)

(52) U.S. Cl.
    CPC .... *C23C 16/0227* (2013.01); *C23C 16/45527* (2013.01); *C23C 16/45553* (2013.01); *C23C 16/45555* (2013.01); *C23C 16/52* (2013.01); *C30B 25/16* (2013.01); *C30B 25/186* (2013.01); *C30B 29/46* (2013.01); *C30B 29/64* (2013.01); *C01P 2002/82* (2013.01); *C01P 2002/85* (2013.01); *C01P 2004/03* (2013.01); *C01P 2004/04* (2013.01)

(58) Field of Classification Search
    CPC ... C23C 16/45553; C30B 29/64; C30B 29/46; C30B 25/186; C30B 25/16; C01G 39/06; C01B 17/20; C01P 2002/82; C01P 2004/04; C01P 2002/85; C01P 2004/03
    USPC .............................. 427/248.1–255.7
    See application file for complete search history.

(56) References Cited

U.S. PATENT DOCUMENTS

| | | | |
|---|---|---|---|
| 2007/0065578 A1* | 3/2007 | McDougall | C23C 16/4404 427/248.1 |
| 2012/0058576 A1* | 3/2012 | Beck | H01L 21/02568 |
| 2016/0168694 A1 | 6/2016 | Min | |

OTHER PUBLICATIONS

Jeon (Jeon et al, "Layer-controlled CVD growth of large-area two-dimensional MoS2 films", Nanoscale 2015, 7, 1688-1695) (Year: 2015).*

Yi-Hsien Lee et al., "Synthesis of Large-Area $MoS_2$ Atomic Layers with Chemical Vapor Deposition", Advanced Materials, 2012, pp. 2320-2325, vol. 24.

Kibum Kang et al., "High-mobility three-atom-thick semiconducting films with wafer-scale homogeneity", Nature, Apr. 30, 2015, pp. 656-660, vol. 520.

Hannes Schweiger et al., "Shape and Edge Sites Modifications of $MoS_2$ Catalytic Nanoparticles Induced by Working Conditions: A Theoretical Study", Journal of Catalysis, 2002, pp. 76-87, vol. 207.

V. Kranthi Kumar et al., "A predictive approach to CVD of crystalline layers of TMDs: the case of $MoS_2$", Nanoscale, 2015, pp. 7802-7810, vol. 7.

Jaeho Jeon et al., "Layer-controlled CVD growth of large-area two-dimensional $MoS_2$ films", Nanoscale, 2015, pp. 1688-1695, vol. 7.

Shraddha Ganorkar et al., "Effect of precursor on growth and morphology of $MoS_2$ monolayer and multilayer", Journal of Physics and Chemistry of Solids, 2015, pp. 32-37, vol. 87.

Yifei Yu et al., "Controlled Scalable Synthesis of Uniform, High-Quality Monolayer and Few-layer $MoS_2$ Films", Scientific Reports, 2013, pp. 1-6, vol. 3, No. 1866.

Jihun Mun et al., "Low-temperature growth of layered molybdenum disulphide with controlled clusters", Scientific Reports, Feb. 23, 2016, pp. 1-7, vol. 6, No. 21854.

* cited by examiner

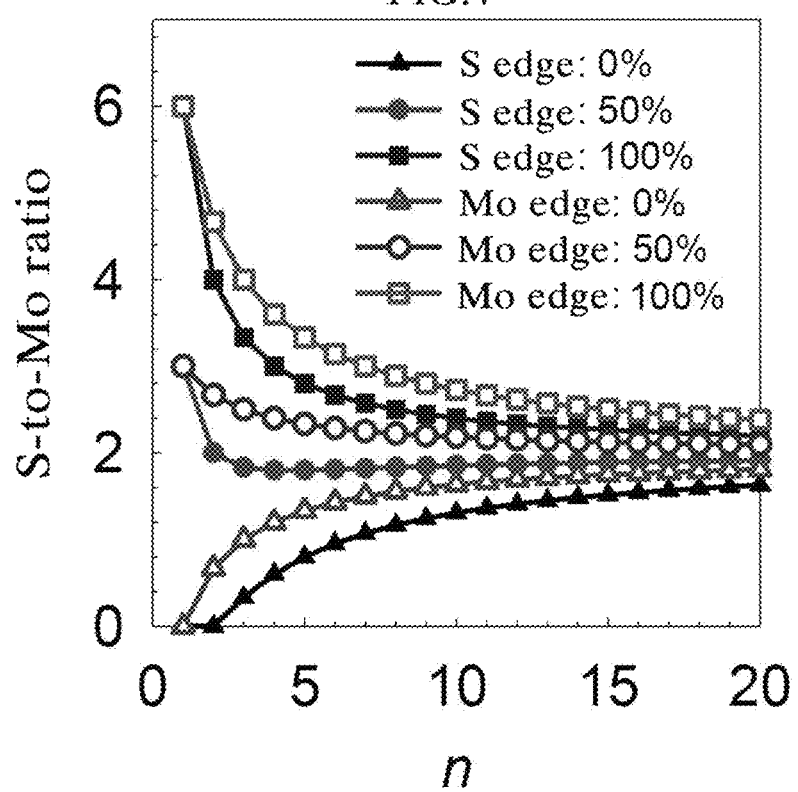

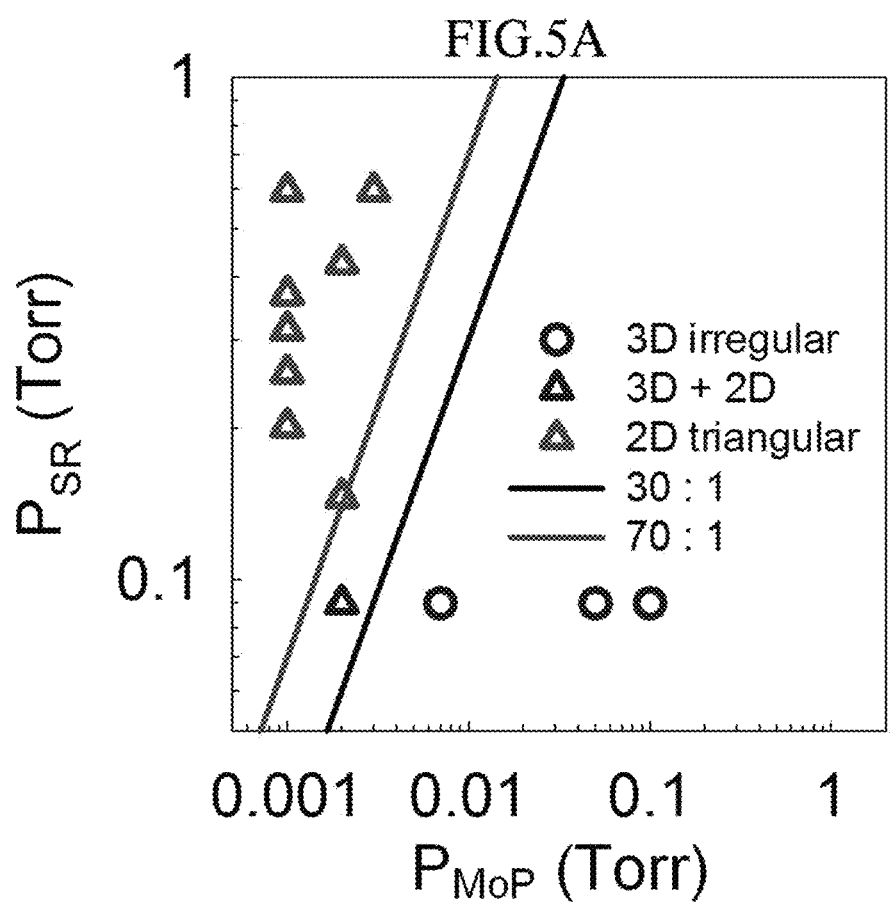

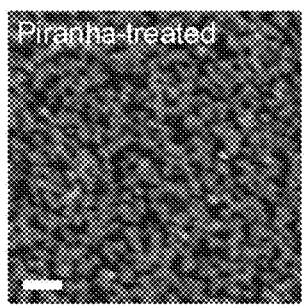
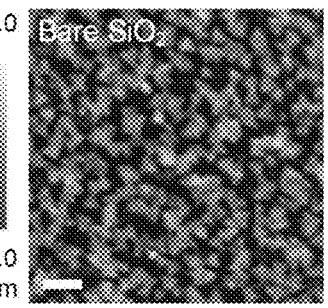
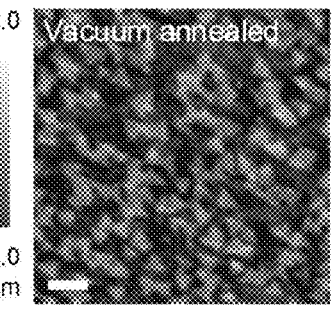
FIG.8A  FIG.8B  FIG.8C
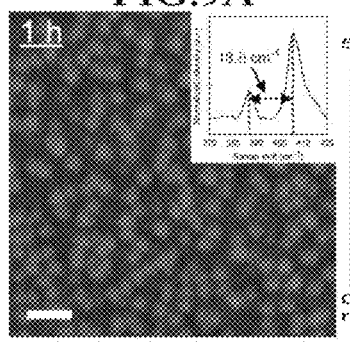
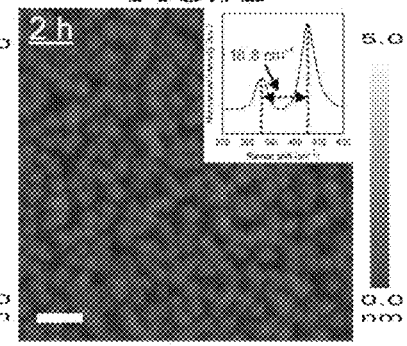
FIG.9A  FIG.9B
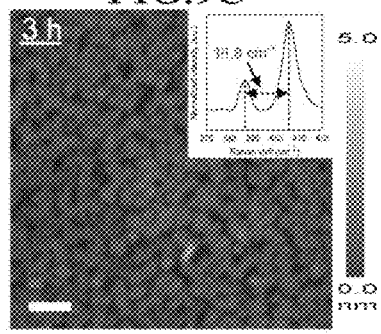
FIG.9C FIG.10A
FIG.10B
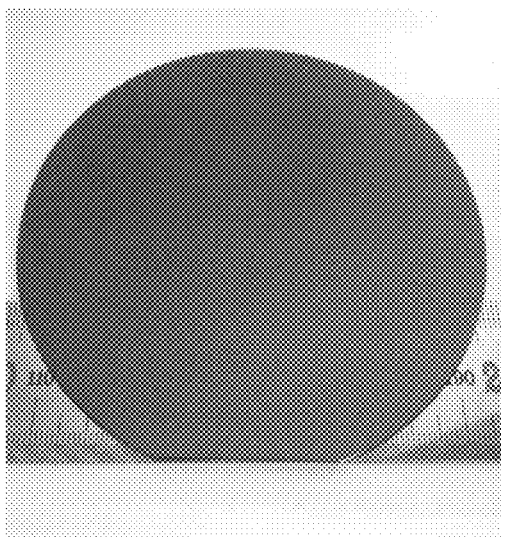
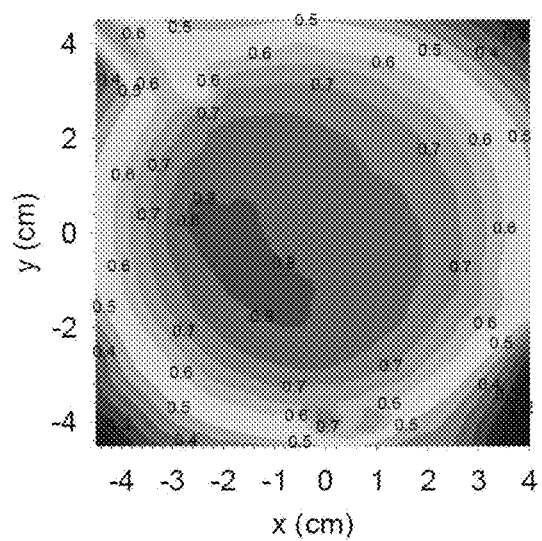

● : 2D transition metal dichalcogenide particles

● : 2D transition metal dichalcogenide particles
● ● : H2O particles (inhibitor)

a. Nucleation    b. Crystal growth    c. Formation of highly uniform 2D thin film

METHOD FOR MANUFACTURING TWO-DIMENSIONAL TRANSITION METAL DICHALCOGEMIDE THIN FILM

TECHNICAL FIELD

The present invention relates to a method for preparing a two-dimensional transition metal dichalcogenide and, more particularly, to a method for preparing a highly uniform two-dimensional transition metal dichalcogenide thin film.

BACKGROUND ART

The two-dimensional (2D) material means a material having a layered structure and its representative examples include graphene, transition metal dichalcogenide, etc. Further, a two-dimensional material with a thickness that is determinant to the physical/chemical properties of the material in contrast to bulkiness is referred to as "two-dimensional thin film".

A variety of researches show that graphene is a promising material as a substitute for the existing materials used in the electronic devices. Despite its excellent properties in terms of high electron mobility, elasticity, thermal conductivity, and ductility, graphene is not suitable for transistors and optical devices due to its problem that it has a lack of band gap (0 eV for pure graphene). In contrast, transition metal dichalcogenides, such as molybdenum disulfide ($MoS_2$) having a lamination structure in which one layer of molybdenum atoms is sandwiched between two layers of sulfur atoms through covalent bonds and Van-der-Waals attraction, have a universally tunable band gap (from an indirect band gap of 1.2 eV (bulk) to a direct band gap of 1.8 eV (monolayer)) and atmospheric stability and thus are getting the spotlight as a new two-dimensional material.

The $MoS_2$ monolayer, first produced by the micromechanical exfoliation method similar to the approach method for the production of graphene, is counted as a promising channel material for field effect transistors (FETs). Since the publication of researches on the electrical properties of $MoS_2$ using the dielectric screening method, studies have been performed on the various synthesis processes for $MoS_2$, including micromechanical and chemical exfoliation, lithiation, thermolysis, and two-step thermal evaporation. With the subsequent exploitation of the sulfurization of pre-deposited molybdenum (Mo) films, the sulfurization process is verified as an appropriate synthesis method for large-area $MoS_2$. However, the $MoS_2$ produced from the sulfurization of pre-deposited molybdenum (Mo), relative to the exfoliated $MoS_2$, has non-uniformity and low dielectric effect mobility and occasionally grows in the vertical direction on the substrate due to incomplete bonding between the pre-deposited Mo and sulfur (S). The chemical vapor deposition (CVD) is a well-known growth method for large-area $MoS_2$. Therefore, the CVD method using sulfur powder and molybdenum oxysulfide ($MoO_{3-x}$) reduced from molybdenum trioxide ($MoO_3$) can be used as a very effective method of growing $MoS_2$ atomic layers on a dielectric substrate [Lee, Y. H. et al., "Synthesis of large-area $MoS_2$ atomic layers with chemical vapor deposition", Adv. Mater. 24, 2320-2325 (2012)]. Studies have also been made on the production of large-area $MoS_2$ with high quality that is of a larger crystal size or controllable in terms of the number of layers.

There has ever been no report on the appropriate method for the growth of $MoS_2$ at low temperatures of 500° C. or less or below 400° C., so sulfurization of $MoO_{3-x}$ at high temperatures ranging form 550° C. to 850° C. is still on demand. Despite some studies made on the use of molybdenum pentachloride ($MoCl_5$) or molybdenum hexacarbonyl [$Mo(CO)_6$] as a new precursor for the growth of $MoS_2$, the synthesis at low temperatures tends to induce the creation of $MoS_2$ having a three-dimensional structure on the substrate. Typically, the higher temperature leads to the use of fewer nuclei, the larger surface diffusion length, and the more effective desorption of volatile substances and thus makes the growth of high-quality films easier. In contrast, the lower temperature results in the smaller critical radius for the nucleation and the smaller surface diffusion length, so it is challenging to the growth of a high-quality film, particularly a monolayer.

There are two representative properties determinant to the quality of the two-dimensional thin films: grain size and uniformity. Conventionally, the two-dimensional thin films with a larger grain size are considered to have the higher quality. According to a recent research [K. Kang, X. Xie, L. Huang, Y. Han, P. Y. Huang, K. F. Mak, C.-J. Kim, D. Muller & J. Park, "High-mobility three-atom-thick semiconducting films with wafer-scale homogeneity", Nature, 520, 656-660, 2015], a highly uniform two-dimensional thin film produced by the CVD method has material properties three to four times more excellent than those of the second-dimensional thin film prepared by the exfoliation method and known to have a highest quality. Hence, the synthesis of two-dimensional thin films with high uniformity is emerging as a core technology deciding the quality of the two-dimensional thin films.

The current $MoS_2$ production methods require the high temperature condition of at least 550° C. in order to synthesize $MoS_2$ films with a uniform thickness. Further, there has never been yet reported any appropriate synthesis method for $MoS_2$ with a uniform thickness at low temperatures of 550° C. or below. Under the high temperature condition, the mobility of $MoS_2$ molecules on the surface of the substrate (typically, dielectric substrate) is so high that a monolayer (i.e., a first layer) of $MoS_2$ rather than a bilayer (i.e., a second layer) is produced uniformly in a large area (at least 8 in.) on the substrate. Under the low temperature condition, the $MoS_2$ molecules have such an extremely low mobility on the surface of the substrate to grow into crystals larger than a defined grain size, incurring the creation of a bilayer of $MoS_2$ before the large-area substrate is entirely coated with a monolayer of $MoS_2$. This induces the formation of $MoS_2$ having a three-dimensional (3D) structure on the substrate.

More specifically, the mobility of molecules on the surface of the substrate is expressed in terms of the diffusion length according to the Einstein's relation (Equation 1). When the synthesis temperature is extremely low, the surface diffusion length is so small as to cause evaporation of the molecules from the surface before the formation of molecular bondings. Further, the Van-der-Waals attraction prevents the molecules adsorbed onto the monolayer from moving towards the edge sides of the monolayer and provides nucleation sites for the growth a bilayer to synthesize a thin film typically in the Volmer-Weber or Stranski-Krastanow growth mode (Refer to FIG. 14). Hence, the synthesis of a monolayer thin film with high uniformity is generally performed at high temperature. In other words, under the high temperature synthesis condition, a thin film is synthesized in the Frank-Van der Merve growth mode due to the high mobility of molecules on the surface of the substrate, so the whole substrate can be coated with a monolayer thin film. But, under the low temperature synthesis condition, the mobility of molecules on the surface of the substrate is so low as to induce the synthesis of a thin film in the Volmer-Weber or Stranski-Krastanow growth mode, resulting in a failure to coat the whole substrate with a monolayer thin film.

$$\lambda = \lambda_0 \exp\left(\frac{E_a - E_d}{2K_B T}\right) \qquad \text{[Equation 1]}$$

$\lambda$: Diffusion length, $T$: Temperature, $\lambda_0$: Pre-exponetial factor, $E_a$: Adsorption energy, $E_d$: Diffusion barrier, $K_B$: Boltzmann constant Accordingly, there is a demand for the development of a preparation method for a two-dimensional thin film with high uniformity, more specifically, a highly uniform two-dimensional transition metal dichalcogenide thin film on a substrate having a large area of at least 8 in. even in the low temperature condition of 500° C. or below.

DISCLOSURE OF INVENTION

The present invention is to provide a method for preparing a two-dimensional transition metal dichalcogenide. Further, it is an object of the present invention to provide a method for preparing a highly uniform two-dimensional transition metal dichalcogenide thin film, more specifically, a method for preparing a highly uniform two-dimensional transition metal dichalcogenide thin film in the low temperature condition of 500° C. or below.

In a first aspect of the present invention, there is provided a method for preparing a two-dimensional transition metal dichalcogenide that includes: pre-treating a substrate in a deposition chamber; and introducing a chalcogen-containing precursor and a transition-metal-containing precursor into the deposition chamber to deposit a two-dimensional transition metal dichalcogenide on the substrate.

In a second aspect of the present invention, there is provided a method for preparing a two-dimensional transition metal dichalcogenide thin film that includes: performing a surface treatment on a substrate in a deposition chamber to reduce the surface energy of the substrate; and introducing a chalcogen-containing precursor, a transition-metal-containing precursor, and a precursor-decomposition-accelerating catalyst into the deposition chamber to deposit a two-dimensional transition metal dichalcogenide monolayer on the substrate.

The deposition step may include further adding an inhibitor for preventing the creation of a two-dimensional transition metal dichalcogenide bilayer.

The inhibitor has an adsorption energy higher on the edge planes of the substrate and the transition metal dichalcogenide monolayer rather than on the basal plane of the two-dimensional transition metal dichalcogenide monolayer. And, the chalcogen has an adsorption energy higher on the basal planes of the substrate and the transition metal dichalcogenide monolayer than on the edge plane of the transition metal dichalcogenide monolayer.

The precursor-decomposition-accelerating catalyst may accelerate the decomposition of the chalcogen-containing precursor containing a ligand bonded to a chalcogen atom to separate the ligand from the chalcogen atom and/or the decomposition of the transition-metal-containing precursor containing a ligand bonded to a transition metal atom to separate the ligand from the transition metal atom.

The surface treatment of the substrate may be performed by a wet surface treatment method selected from the group consisting of piranha solution treatment, sulfuric acid ($H_2SO_4$) solution treatment, hydrochloric acid (HCl) solution treatment, and alkali metal hydroxide solution treatment; or a dry surface treatment method selected from the group consisting of $O_2$ plasma thermal treatment and water vapor thermal treatment.

The substrate may be selected from the group consisting of $SiO_2$, $Al_2O_3$, $HfO_2$, $LiAlO_3$, MgO, Si, Ge, GaN, AlN, GaP, InP, GaAs, SiC, glass, quartz, sapphire, graphite, graphene, plastic, polymer, boron nitride (h-BN), and a combination thereof.

The substrate may be selected from the group consisting of $SiO_2$, $Al_2O_3$, $HfO_2$, $LiAlO_3$, MgO, and a combination thereof. And, the surface treatment of the substrate may be performed by a wet surface treatment method selected from the group consisting of piranha solution treatment, sulfuric acid ($H_2SO_4$) solution treatment, hydrochloric acid (HCl) solution treatment, and alkali metal hydroxide solution treatment; or a dry surface treatment method selected from the group consisting of $O_2$ plasma thermal treatment and water vapor thermal treatment.

The chalcogen-containing precursor may include an S-containing organic compound or an S-containing inorganic compound.

The transition-metal-containing precursor may include a transition metal selected from the group consisting of Ti, V, Cr, Mn, Fe, Co, Ni, Cu, Zn, Nb, Ta, Mo, W, Tc, Re, Ru, Os, Rh, Ir, Pt, Ag, Au, Cd, In, Tl, Sn, Pb, Sb, Bi, Zr, Te, Pd, Hf, and a combination thereof.

The partial pressure ratio of the chalcogen-containing precursor to the transition-metal-containing precursor may be at least ½.

Further, the partial pressure ratio of the chalcogen-containing precursor to the transition-metal-containing precursor may be at least 2.

The deposition step may be performed at a temperature of 500° C. or below.

The deposition step may be performed through a chemical vapor deposition (CVD) method.

In the deposition step, the partial pressure ratio of the chalcogen-containing precursor to the transition-metal-containing precursor may be increased to reduce the size of a cluster of the transition metal dichalcogenide created by gas phase reaction and the surface energy of the substrate, thereby inducing a two-dimensional growth of the transition metal dichalcogenide.

In the deposition step, the amount of the carrier gas or the temperature of the chalcogen-containing precursor and the transition-metal-containing precursor is adjusted to control the amounts of the chalcogen-containing precursor and the transition-metal-containing precursor to be introduced into the deposition chamber, so the partial pressure ratio of the chalcogen-containing precursor to the transition-metal-containing precursor can be under control.

As another means for solving the problems with the prior art, the present invention provides a method for preparing a two-dimensional transition metal dichalcogenide thin film that includes: (1) performing a surface treatment on a substrate in a deposition chamber to reduce the surface energy of the substrate; (2) introducing a chalcogen-containing precursor and a transition-metal-containing precursor into the deposition chamber at a temperature of 500° C. or below and a first pressure of 0.001 to 760 Torr to create crystals of the two-dimensional transition metal dichalcogenide on the substrate; (3) introducing the chalcogen-containing precursor and the transition-metal-containing precursor into the deposition chamber at a second pressure higher than the first pressure of the step (2) to increase the crystal size of the two-dimensional transition metal dichalcogenide on the substrate; and (4) introducing the chalcogen-containing precursor and the transition-metal-containing precursor into the deposition chamber at a third pressure higher than the second pressure of the step (3) to form a two-dimensional transition metal dichalcogenide monolayer on the substrate.

In the steps (2), (3) and (4), a precursor-decomposition-accelerating catalyst may be further added into the deposition chamber In the steps (2), (3) and (4), an inhibitor for preventing the creation of a two-dimensional transition metal dichalcogenide bilayer may be further added into the deposition chamber.

EFFECTS OF THE INVENTION

In accordance with one embodiment of the present invention, the size of a cluster (or crystal) of the two-dimensional transition metal dichalcogenide and the nucleation sites are controlled to enable the preparation of a large-area two-dimensional transition metal dichalcogenide thin film with high uniformity at a low temperature of about 600° C. or below or about 500° C. or below. As the growth at low temperatures in the above-defined range is enabled, it is possible to grow a large-area two-dimensional transition metal dichalcogenide thin film with high uniformity directly on a flexible substrate.

The two-dimensional transition metal dichalcogenide thin film according to one embodiment of the present invention may be used as a device. The thin film is a polycrystalline monolayer and a two-dimensional structure at once, so it can be used as the next-generation flexible device or wearable device.

BRIEF DESCRIPTIONS OF DRAWINGS

FIG. 4 is a graph showing the S-to-Mo ratio of the two-dimensional transition metal dichalcogenide as a function to the edge type in accordance with one embodiment of the present invention.

Figure 5B:
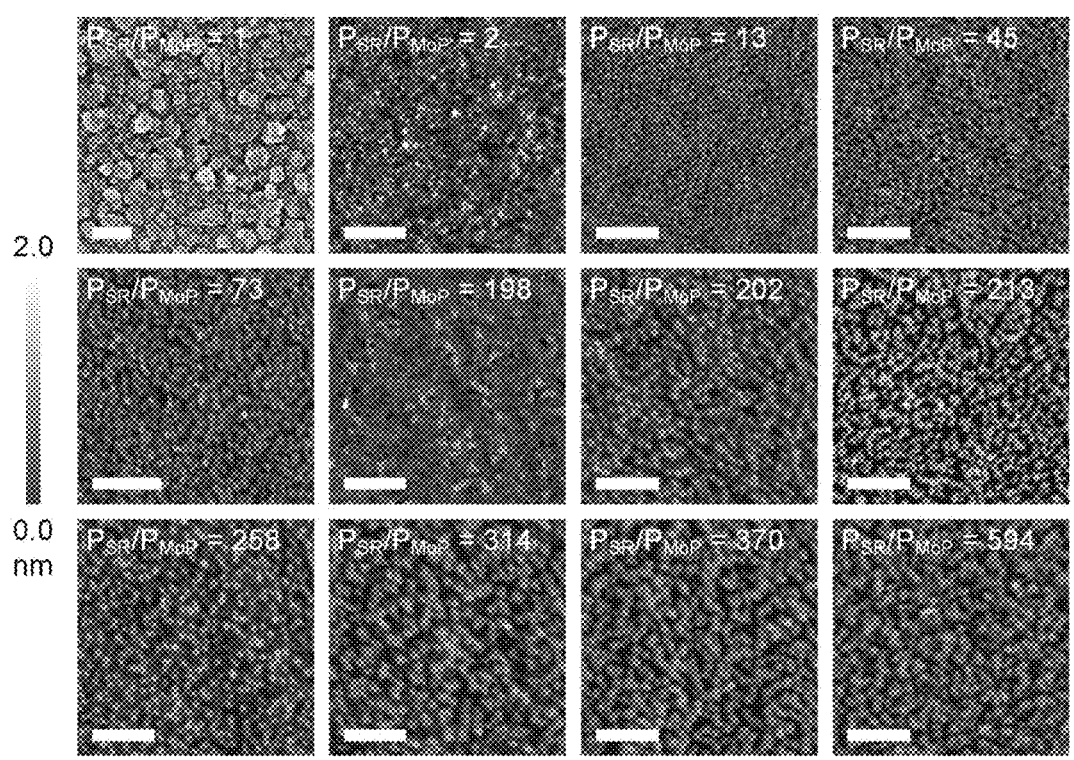
FIG. 5A is a graph showing the growth window of the two-dimensional transition metal dichalcogenide grown at a low temperature in accordance with one embodiment of the present invention.

FIG. 5B presents microscopic images of the two-dimensional transition metal dichalcogenide grown at varying partial pressure ratios ($P_{SR}/P_{MoP}$) in accordance with one embodiment of the present invention.

FIGS. 6A to 6H show the structure [6A], cluster-size control mechanism [6B and 6C], Raman spectra [6D and 6E], photoluminescence spectrum [6F], and XPS spectra [6G and 6H] of the two-dimensional transition metal dichalcogenide grown at varying partial pressure ratios ($P_{SR}/P_{MoP}$) in accordance with one embodiment of the present invention.

Figure 7:
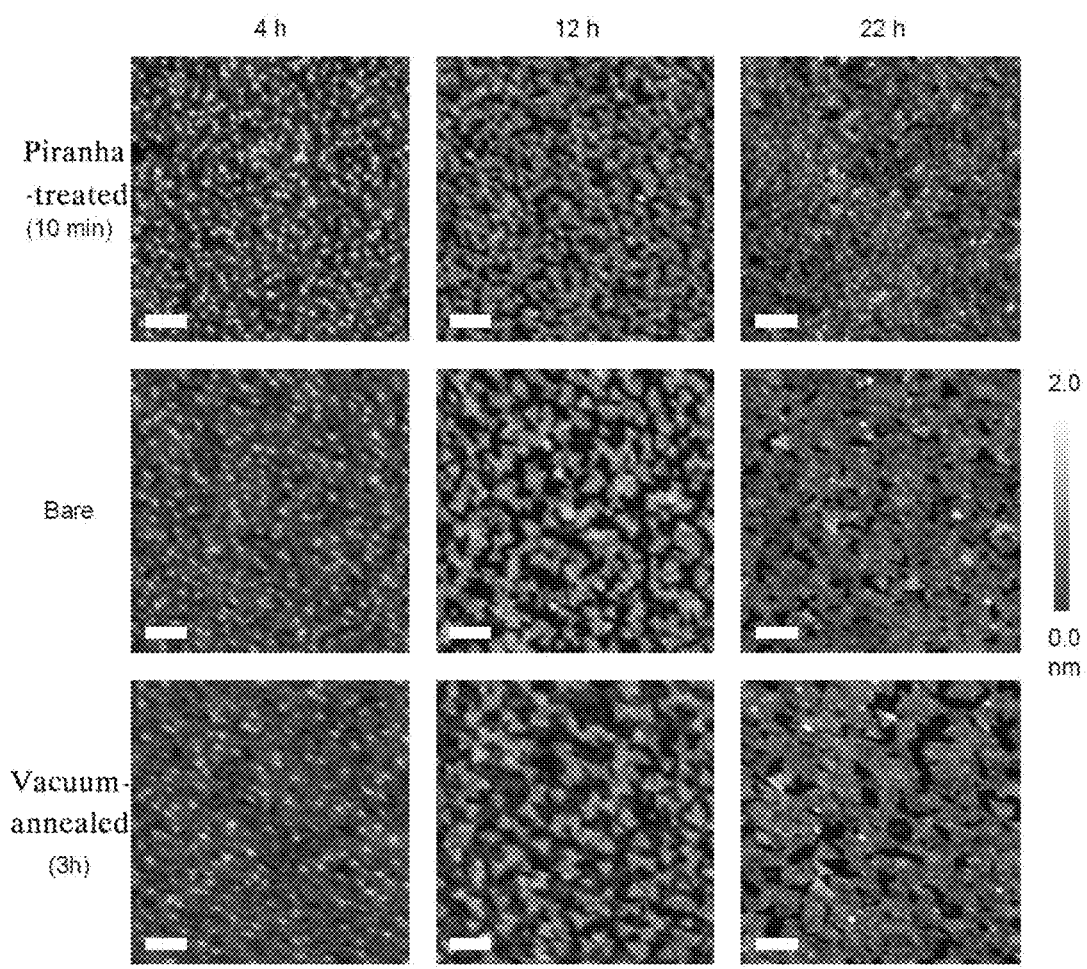

FIG. 7 presents AFM images of the two-dimensional transition metal dichalcogenide grown as a function of the growth time on varying substrates in accordance with one embodiment of the present invention.

FIGS. 8A, 8B and 8C are AFM images of the two-dimensional transition metal dichalcogenide grown on varying substrates in accordance with one embodiment of the present invention.

FIGS. 9A to 9F present the microscopic images and the Raman spectra of the two-dimensional transition metal dichalcogenide grown as a function of the growth time in accordance with one embodiment of the present invention.

FIGS. 10A and 10B show the image [10A] of a two-dimensional transition metal dichalcogenide monolayer grown on a large-area wafer and the analytical results of the ellipsometry mapping of the two-dimensional transition metal dichalcogenide [10B] in accordance with one embodiment of the present invention.

FIGS. 11A to 11D show the images [11A] of the two-dimensional transition metal dichalcogenide monolayer, bilayer, trilayer, quadlayer, or pentalayer, the Raman spectra [11B and 11C] of the two-dimensional transition metal dichalcogenide, and the photoluminescence spectrum [11D] of the two-dimensional transition metal dichalcogenide in accordance with one embodiment of the present invention.

FIGS. 12A to 12D show the low-magnification HRTEM image [12A] of a transferred three-dimensional transition metal dichalcogenide and the low-magnification HRTEM images [12B, 12C and 12D] of unselective sites of the two-dimensional transition metal dichalcogenide in accordance with one embodiment of the present invention.

Figure 13A:
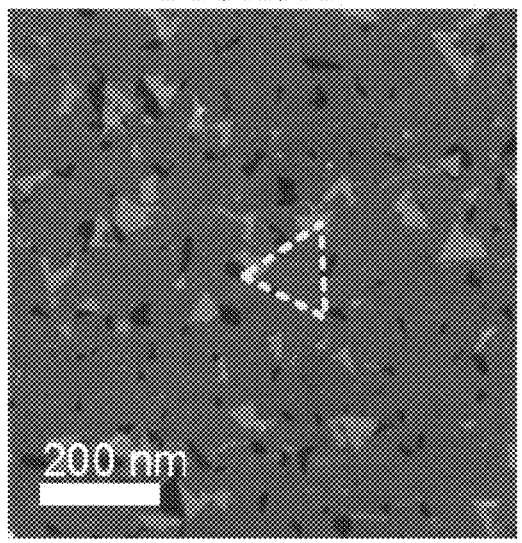
Figure 13B:
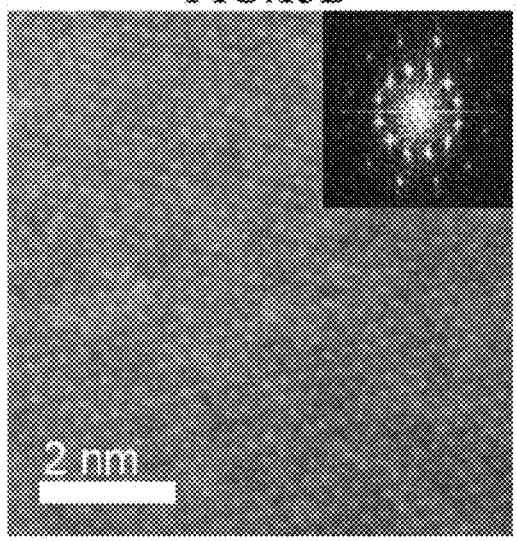

FIGS. 13A to 13D show the low-magnification STEM-HAADF image [13A] of a two-dimensional transition metal dichalcogenide, the high-magnification STEM-HAADF image [13B] of the grain boundary of the two-dimensional transition metal dichalcogenide, the equalized and Fourier-filtered image [13C] of FIG. 13B, and the graph [13D] showing the electrical properties of a manufactured FET device in accordance with one embodiment of the present invention.

Figure 14:
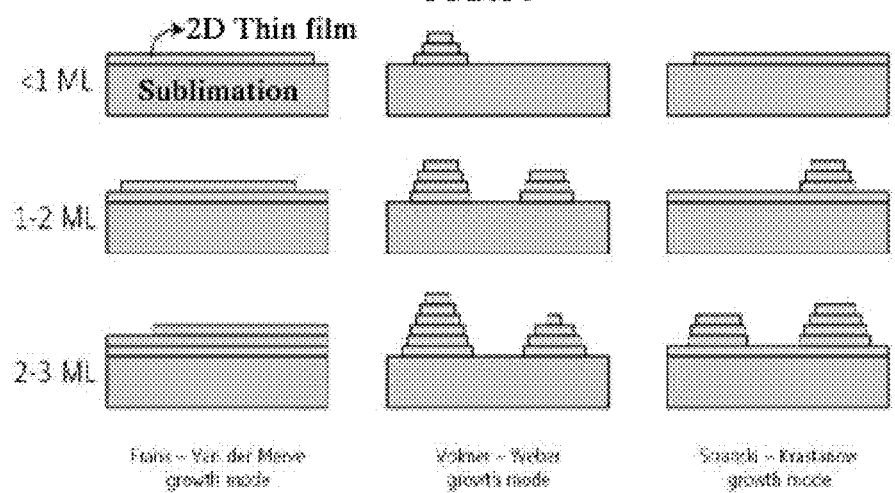

FIG. 14 presents mimetic diagrams showing the growth modes of a thin film on the surface of a substrate. Generally, under the high-temperature condition (e.g., 550° C. or above), a thin film is synthesized in the Frank-Van der Merve growth mode due to the high mobility of molecules on the surface of the substrate, so the whole substrate can be coated with a monolayer (ML) thin film. Under the low temperature condition (e.g., 500° C. or below), a thin film is synthesized in the Volmer-Weber or Stranski-Krastanow growth mode due to the low mobility of molecules on the surface of the substrate, resulting in a failure to coat the whole substrate with a monolayer (ML) thin film.

FIG. 15 presents scanning electron microscopic (SEM) images showing the nucleation on the surface of a $SiO_2$ substrate at varying concentrations of the potassium hydroxide (KOH) solution for the surface treatment of the substrate in the step of reducing the surface energy in accordance with one embodiment of the present invention.

FIG. 16 presents scanning electron microscopic (SEM) images showing the results of the synthesis of a two-dimensional transition metal dichalcogenide thin film with/without the use of a precursor-decomposition-accelerating catalyst in the deposition step in accordance with one embodiment of the present invention.

FIGS. 17A to 17E are scanning electron microscopic (SEM) images [17A, 17B and 17C] and Raman spectra [17D and 17E] showing the synthesis results of a two-dimensional transition metal dichalcogenide thin film at varying temperatures in the deposition chamber.

FIG. 18 presents mimetic diagrams showing the results of the synthesis of a two-dimensional transition metal dichalcogenide thin film with/without the use of an inhibitor for preventing the creation of a two-dimensional transition metal dichalcogenide bilayer in the deposition step in accordance with one embodiment of the present invention.

FIG. 19 presents scanning electron microscopic (SEM) images showing the synthesis of a two-dimensional transition metal dichalcogenide thin film with/without the use of an inhibitor for preventing the creation of a two-dimensional transition metal dichalcogenide bilayer in the deposition step in accordance with one embodiment of the present invention.

FIG. 20 presents scanning electron microscopic (SEM) images showing the synthesis of a two-dimensional transition metal dichalcogenide thin film at varying pressures in the deposition chamber in accordance with one embodiment of the present invention.

Figure 21:
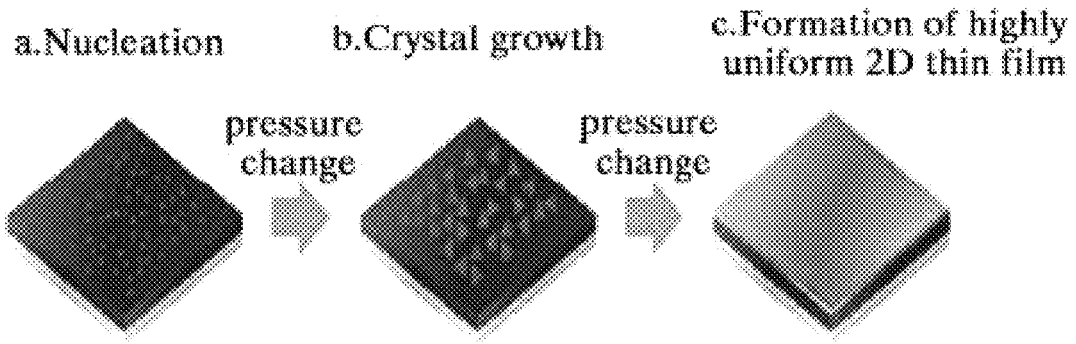

FIG. 21 presents mimetic diagrams showing a method for preparing a two-dimensional transition metal dichalcogenide thin film that includes the steps of: (a) creating nuclei for a predetermined time under the condition to form plenty of nuclei on a substrate; (b) growing small-sized nuclear crystals to a larger size into on the substrate by varying the pressure; and (c) forming a highly uniform two-dimensional transition metal dichalcogenide monolayer thin film on the substrate by varying the pressure.

BEST MODES FOR CARRYING OUT THE INVENTION

Hereinafter, a detailed description will be given as to the embodiments of the present invention with reference to the accompanying drawings in order for those skilled in the art to embody the present invention with ease. But the present invention is susceptible to variations and modifications and not limited to the embodiments described herein. In the drawings, a the portions detailed description of known configurations and functions irrelative to the illustration of the present invention will be omitted to make the description of the present invention clear. The same reference numerals are used throughout the different drawings to designate the same or similar components as possible.

Throughout the specification of the present invention, it will be understood that when an element is referred to as being "connected", "associated" or "coupled" to another element, it can be "directly" connected or coupled to the other element, or "electrically" connected or coupled to the other element, with intervening elements present between the elements.

Throughout this specification, it will also be understood that when an element is referred to as being "on" another element, it can be "directly on" the other element or intervening elements may also be present.

Throughout this specification, it will also be understood that the terms "comprises" and/or "comprising" specify the presence of the stated component but do not preclude the presence or addition of one or more other components.

The term "about or approximately" or "substantially" as used throughout this specification are intended to have meanings close to numerical values or ranges specified with an allowable error and intended to prevent accurate or absolute numerical values disclosed for the understanding of the present invention from being illegally or unfairly used by any unconscionable third party. Through the specification, the term "step of" does not mean "step for".

Throughout this specification, the term "combination of" included in Markush type description means a mixture or combination of one or more components selected from a group consisting of the components described in Markush type and thereby means that the disclosure includes one or more components selected from the Markush group.

Throughout this specification, the phrase in the form "A and/or B" means "A or B, or A and B".

Throughout this specification, the term "cluster" as used herein refers to the transition metal dichalcogenide particles created by the gas phase reaction between chalcogen atoms and transition metal atoms produced from the decomposition of the chalcogen-containing precursor and the transition-metal-containing precursor introduced in a deposition chamber.

Throughout this specification, the term "crystal" as used herein refers to the transition metal dichalcogenide particles created by the surface reaction of chalcogen atoms and transition metal atoms after the adsorption of the chalcogen-containing precursor and the transition-metal-containing precursor introduced in a deposition chamber on the surface of a substrate, or after the diffusion of the cluster produced by the gas phase reaction on the surface of the substrate.

Hereinafter, the embodiments and examples of the present invention will be described with reference to the accompanying drawings. It should be understood that the present invention is not confined to the embodiments, examples and drawings of the present invention as presented in this specification.

In a first aspect of the present invention, there is provided a method for preparing a two-dimensional transition metal dichalcogenide that includes: pre-treating a substrate in a deposition chamber; and introducing a chalcogen-containing precursor and a transition-metal-containing precursor into the deposition chamber to deposit a two-dimensional transition metal dichalcogenide on the substrate.

In one embodiment of the present invention, the cluster size and the nucleation site of a two-dimensional transition metal dichalcogenide are controlled to enable the preparation of a large-area two-dimensional transition metal dichalcogenide with high quality at a low temperature of about 600° C. or below and the production of a device having good electrical performances using the two-dimensional transition metal dichalcogenide.

In one embodiment of the present invention, the deposition process may be performed at a low temperature of, if not limited to, about 600° C. or below. For example, the temperature range may include, but is not limited to, about 600° C. or below, about 500° C. or below, about 400° C. or below, about 100° C. to about 600° C., about 200° C. to about 600°

C., about 400° C. to about 600° C., about 100° C. to about 400° C., or about 200° C. to about 400° C.

In one embodiment of the present invention, the deposition process may use the known deposition methods in the related art without specific limitation. For example, the deposition process may be performed by, if not limited to, the chemical vapor deposition method. Examples of the chemical vapor deposition method may include, but are not limited to, low pressure chemical vapor deposition (LP-CVD), atmospheric pressure chemical vapor deposition (APCVD), metal organic chemical vapor deposition (MOCVD), plasma-enhanced chemical vapor deposition (PECVD), inductively coupled plasma chemical vapor deposition (ICP-CVD), atomic-layer chemical vapor deposition, or plasma-enhanced atomic layer deposition.

In one embodiment of the present invention, the transition-metal-containing precursor may include, but is not limited to, a transition metal selected from the group consisting of Ti, V, Cr, Mn, Fe, Co, Ni, Cu, Zn, Nb, Ta, Mo, W, Tc, Re, Ru, Os, Rh, Ir, Pt, Ag, Au, Cd, In, Tl, Sn, Pb, Sb, Bi, Zr, Te, Pd, Hf, and a combination thereof. For example, the transition-metal-containing precursor may include, but is not limited to, any one selected from the group consisting of $Mo(CO)_6$, $Mo(Cl)_5$, $MoO(Cl)_4$, $MoO_3$, and a combination thereof.

In one embodiment of the present invention, the chalcogen-containing precursor may include any one selected from the group consisting of $H_2S$, $CS_2$, $SO_2$, $S_2$, $H_2Se$, $H_2Te$, $R_1SR_2$, (where, $R_1$ and $R_2$ are independently C1-C6 alkyl, C2-C6 alkenyl or C2-C6 alkynyl), $(NH_4)_2S$, $C_6H_8OS$, $S(C_6H_4NH_2)_2$, $Na_2SH_2O$, and a combination thereof. Preferably, the chalcogen-containing precursor may be, but not limited to, an S-containing organic compound or an S-containing inorganic compound selected from the group consisting of $H_2S$, $CS_2$, $SO_2$, $S_2$, $R_1SR_2$, (where, $R_1$ and $R_2$ are independently C1-C6 alkyl, C2-C6 alkenyl or C2-C6 alkynyl), $(NH_4)_2S$, $C_6H_8OS$, $S(C_6H_4NH_2)_2$, $Na_2SH_2O$, and a combination thereof.

In one embodiment of the present invention, the size of the cluster of the two-dimensional transition metal dichalcogenide to be deposited may be controlled by, if not limited to, adjusting the partial pressure ratio ($P_{CP}/P_{MP}$) of the chalcogen-containing precursor (hereinafter, referred to as "$P_{CP}$") to the transition-metal-containing precursor (hereinafter, referred to as "$P_{MP}$"). With the size of the cluster under control, there may occur, if not limited to, a structural variation of the two-dimensional transition metal dichalcogenide to be deposited.

In one embodiment of the present invention, if not limited to, during the deposition process, the carrier gas is not used or the flow rate of the carrier gas is minutely adjusted to control the internal pressure of the deposition chamber, so the amounts of the chalcogen-containing precursor and the transition-metal-containing precursor introduced into the deposition chamber can be minutely adjusted to control the partial pressure ratio of the chalcogen-containing precursor to the transition-metal-containing precursor.

In one embodiment of the present invention, if not limited to, the surface energy and the size of a cluster formed by gas phase reaction during the deposition of the transition metal dichalcogenide can be controlled by adjusting the partial pressure ratio of the chalcogen-containing precursor to the transition-metal-containing precursor, thereby inducing the two-dimensional growth of the transition metal dichalcogenide.

In one embodiment of the present invention, a gas phase reaction and a surface reaction on the substrate are incurred simultaneously in the deposition step, e.g., the chemical vapor deposition step. In the gas phase reaction, gaseous substances react with one another to create a cluster of the transition metal dichalcogenide. The cluster is transferred to the surface of the substrate to cause a surface reaction. The cluster is formed to a larger size at the lower partial pressure ratio ($P_{CP}/P_{MP}$) of the chalcogen-containing precursor to the transition-metal-containing precursor. The cluster is transferred to the surface of the substrate, where nucleation takes place on the surface of the substrate. The gaseous substances stick together to grow the cluster in the form of an island (called as "nucleus" if it is of a predetermined size and as "island" when it grows larger than the predetermined size). At this point, the cluster created from the gaseous substances is transferred to the surface of the substrate through diffusion. When the surface of the substrate is under the high temperature condition (e.g., 550° C. or above), the crystal can grow into a two-dimensional structure due to the surface diffusion effect. When the surface of the substrate is under the low temperature condition (e.g., 500° C. or below), the surface diffusion effect is not made enough due to a lack of energy. Accordingly, the partial pressure ratio ($P_{CP}/P_{MP}$) of the chalcogen-containing precursor to the transition-metal-containing precursor is raised to such a high extent to reduce the size of the cluster created by the gas phase reaction, and the surface energy of the substrate reduces during the surface reaction, thereby to control the structure of the two-dimensional transition metal dichalcogenide thin film to be deposited under low temperature conditions.

In one embodiment of the present invention, as the partial pressure ratio ($P_{CP}/P_{MP}$) of the chalcogen-containing precursor to the transition-metal-containing precursor increase, the two-dimensional transition metal dichalcogenide to be deposited may have, if not limited to, a composite structure changed from the irregular three-dimensional domain to the two-dimensional triangular domain. With an increase in the partial pressure ratio ($P_{CP}/P_{MP}$) of the chalcogen-containing precursor to the transition-metal-containing precursor, for example, the surface energy of the produced transition metal dichalcogenide is reduced, thereby inducing the two-dimensional growth of the transition metal dichalcogenide.

In one embodiment of the present invention, as the partial pressure ratio ($P_{CP}/P_{MP}$) of the chalcogen-containing precursor to the transition-metal-containing precursor increases, the two-dimensional transition metal dichalcogenide may have a smaller crystal size and completely change into the two-dimensional triangular domain.

In one embodiment of the present invention, the partial pressure ratio ($P_{CP}/P_{MP}$) of the chalcogen-containing precursor to the transition-metal-containing precursor may be, if not limited to, about at least about ½, or at least about 2. For example, the partial pressure ratio ($P_{CP}/P_{MP}$) of the chalcogen-containing precursor to the transition-metal-containing precursor may be, if not limited to, about 1:about 2 or greater, about 1:about 3 or greater, about 1:about 4 or greater, about 1:about 5 or greater, or about 1:about 10 or greater. Preferably, the partial pressure ratio ($P_{CP}/P_{MP}$) of the chalcogen-containing precursor to the transition-metal-containing precursor is, if not limited to, about 1:about 2 to about 600, about 1:about 2 to about 500, about 1:about 2 to about 400, about 1:about 2 to about 300, about 1:about 2 to about 200, or about 1:about 2 to about 100.

In one embodiment of the present invention, a gas phase reaction and a surface reaction on the substrate are incurred simultaneously in the deposition process. In the gas phase reaction, gaseous substances react with one another to create a cluster of the transition metal dichalcogenide. The cluster is transferred to the surface of the substrate to cause a surface reaction. The size of the cluster and the surface energy of the substrate can be controlled by adjusting the partial pressure ratio ($P_{CP}/P_{MP}$) of the chalcogen-containing precursor to the transition-metal-containing precursor, thereby inducing the two-dimensional growth of the transition metal dichalcogenide. For example, the partial pressure ratio ($P_{CP}/P_{MP}$) of the chalcogen-containing precursor to the transition-metal-containing precursor is raised to greatly reduce the size of the cluster of the transition metal dichalcogenide created by the gas phase reaction and to lower the surface energy of the substrate, which ends up inducing the two-dimensional growth of the transition metal dichalcogenide.

In one embodiment of the present invention, in the deposition step, the internal pressure of the deposition chamber is adjusted to control the amounts of the chalcogen-containing precursor and the transition-metal-containing precursor introduced into the deposition chamber and thereby to control the partial pressure ratio ($P_{CP}/P_{MP}$) of the chalcogen-containing precursor to the transition-metal-containing precursor. In the deposition step, for example, if not limited to, the internal pressure of the deposition chamber is controlled by omitting the use of the carrier gas or minutely adjusting the flow rate of the carrier gas, so the amounts of the chalcogen-containing precursor and the transition-metal-containing precursor introduced into the deposition chamber can be minutely adjusted to control the partial pressure ratio ($P_{CP}/P_{MP}$) of the chalcogen-containing precursor to the transition-metal-containing precursor.

In one embodiment of the present invention, if not limited to, as the partial pressure ratio ($P_{CP}/P_{MP}$) of the chalcogen-containing precursor to the transition-metal-containing precursor increases, volatile byproducts are desorbed and grown in the pseudo two-dimensional domain, and the surface diffusion leads to the creation of a monolayer.

In one embodiment of the present invention, if not limited to, an irregular three-dimensional domain having a small grain size can be grown at a low partial pressure ratio ($P_{CP}/P_{MP}$) of the chalcogen-containing precursor to the transition-metal-containing precursor. When the transition metal dichalcogenide grows at a low partial pressure ratio ($P_{CP}/P_{MP}$) of the chalcogen-containing precursor to the transition-metal-containing precursor, for example, a large quantity of the transition-metal-containing precursor is used to produce a large-sized cluster, which is adsorbed onto the surface of the substrate to grow the three-dimensional domain. It is therefore preferable to increase the partial pressure ratio.

In one embodiment of the present invention, if not limited to, the nucleation site of the two-dimensional transition metal dichalcogenide to be deposited is artificially controlled through a pretreatment of the substrate. If not limited to, for example, the control of the nucleation site enables it to control the limited grain size of the two-dimensional transition metal dichalcogenide.

In one embodiment of the present invention, the pretreatment of the substrate may include, but is not limited to, a treatment method selected from the group consisting of vacuum thermal treatment, annealing or high-vacuum annealing, chemical treatment, and a combination thereof. For example, the pretreatment may be the high-vacuum annealing method, by which the dangling bond providing the reactive surface sites on the substrate is decomposed to reduce the number of the nucleation sites, thereby producing a large-area two-dimensional transition metal dichalcogenide with high quality.

In one embodiment of the present invention, the substrate may include, but is not limited to, any one selected from the group consisting of Si, $SiO_2$, Ge, GaN, AlN, GaP, InP, GaAs, SiC, $Al_2O_3$, $LiAlO_3$, MgO, glass, quartz, sapphire, graphite, graphene, plastic, polymer, boron nitride (h-BN), and a combination thereof. Desirably, the substrate as used herein is a material preferred to the materials difficult to synthesize due to a problem associated with the atomic arrangement or the like and favorable in the aspect of the price or large area. The substrate may be a material that functions as a catalyst for the growth of the cluster or a substrate enabling the control of the nucleation site.

In one embodiment of the present invention, if not limited to, a step of pre-cleaning the substrate prior to the pretreatment of the substrate may be further included in order to prevent the occurrence of unnecessary nucleation in the vicinity of the grain. For example, if not limited to, the pre-cleaning step may be performed under the atmospheric conditions.

In one embodiment of the present invention, the pre-cleaning step may be performed by, if not limited to, using water, ethanol, acidic material, alcohol, or RCA. The specific examples of the alcohol as used herein may include, but are not limited to, methanol, ethanol, propanol, butanol, or isomers thereof. The specific examples of the acidic material as used herein may include, but are not limited to, any one selected from the group consisting of $H_2SO_4$, HCl, $HNO_3$, and a combination thereof. For example, if not limited to, the acidic material may be diluted to different percentages before use.

In one embodiment of the present invention, the RCA cleaning method may be performed by using, if not limited to, a combination of $NH_4OH$, $H_2O_2$, and/or HCl. Depending on the RCA combination type, the RCA cleaning method is classified into the ammoniac SC-1 cleaning method and the acidic SC-2 cleaning method.

In one embodiment of the present invention, if not limited to, a vacuum equipment feeding system is used to adjust the pressure of the chamber and hence the introduced amount of each precursor during the deposition of the two-dimensional transition metal dichalcogenide.

In one embodiment of the present invention, if not limited to, the grain size of the two-dimensional transition metal dichalcogenide may be about 10 nm or about 50 nm or greater. For example, the grain size of the two-dimensional transition metal dichalcogenide may be about 10 nm or greater, about 30 nm or greater, about 50 nm or greater, about 70 nm or greater, or about 100 nm or greater, and about 200 nm or less, about 150 nm or less, about 130 nm or less, or about 100 nm or less. More specifically, the grain size of the two-dimensional transition metal dichalcogenide may be, if not limited to, about 10 nm to about 200 nm, about 30 nm to about 200 nm, about 50 nm to about 200 nm, about 50 nm to about 100 nm, about 50 nm to about 90 nm, about 50 nm to about 80 nm, about 50 nm to about 70 nm, about 50 nm to about 60 nm, about 60 nm to about 100 nm, about 60 nm to about 90 nm, about 60 nm to about 80 nm, about 60 nm to about 70 nm, about 70 nm to about 100 nm, about 70 nm to about 90 nm, about 70 nm to about 80 nm, or about 80 nm to about 100 nm.

In one embodiment of the present invention, if not limited to, the two-dimensional transition metal dichalcogenide is applicable to, if not limited to, all the electronic circuits and electronic devices. For example, if not limited to, the device may be used to manufacture electric field effect transistors, optical sensors, light-emitting devices, optical detectors, optomagnetic memory devices, photocatalysts, flat panel displays, flexible devices, solar cells, etc.

In one embodiment of the present invention, the electric field effect transistor including the two-dimensional transition metal dichalcogenide displays high electrical performance and the tendencies of the existing n-type semiconductor.

In a second aspect of the present invention, there is provided a method for preparing a two-dimensional transition metal dichalcogenide thin film that includes: performing a surface treatment on a substrate in a deposition chamber to reduce the surface energy of the substrate; and introducing a chalcogen-containing precursor, a transition-metal-containing precursor, and a precursor-decomposition-accelerating catalyst into the deposition chamber to deposit a two-dimensional transition metal dichalcogenide monolayer on the substrate.

The method for preparing a two-dimensional transition metal dichalcogenide thin film according to the present invention may include the step of reducing the surface energy of the substrate through a surface treatment of the substrate in the deposition chamber. The step of reducing the surface energy of the substrate through the surface treatment of the substrate is performed to have plenty of nucleation sites on the surface of the substrate.

The number of nucleation sites on the surface of the substrate is a very important factor in forming a highly uniform thin film, particularly a monolayer thin film. The control of the surface energy of the substrate is used to control the number of the nucleation sites, which affects the crystal size of the two-dimensional transition metal dichalcogenide and the uniformity of the thin film.

More specifically, when the nucleation sites on the surface of the substrate are sparsely present, the crystal of the transition metal dichalcogenide has a large size, but the whole substrate cannot be coated with a two-dimensional transition metal dichalcogenide thin film and the uniformity of the thin film deteriorates. In contrast, when plenty of nucleation sites are present on the surface of the substrate, the crystal of the transition metal dichalcogenide has a small size, but the whole substrate can be coated with a two-dimensional transition metal dichalcogenide thin film to enhance the uniformity of the thin film. It is therefore possible to control the number of nucleation sites on the surface of the substrate by performing a surface treatment on the substrate.

In one embodiment of the present invention, when the substrate is an oxide-based insulator selected from the group consisting of $SiO_2$, $Al_2O_3$, $HfO_2$, $LiAlO_3$, MgO, and a combination thereof, the hydroxyl groups (—OH) present on the surface of the substrate function as nucleation sites, and the number of the hydroxyl groups (—OH) can be controlled through the various surface treatment methods for the substrate.

In order to increase the hydroxyl groups (—OH) on the surface of the substrate and provide plenty of nucleation sites, a surface treatment of the substrate may be performed by a wet surface treatment method selected from the group consisting of piranha solution treatment, sulfuric acid ($H_2SO_4$) solution treatment, hydrochloric acid (HCl) solution treatment, and alkali metal hydroxide solution treatment; or a dry surface treatment method selected from the group consisting of $O_2$ plasma thermal treatment and water vapor thermal treatment. Examples of the alkali metal hydroxide solution as used herein may include potassium hydroxide solution, sodium hydroxide solution, etc. The wet surface treatment method is not limited to those mentioned above and may use any solution as long as it reduces the surface energy of the oxide-based insulating substrate. In the preparation of a wet surface treatment solution, the solute content of the solution is at least 0.0001 wt. %, preferably 0.0001 wt. % to a percent by weight at the maximum solubility (the upper limit of the content may change according to the type of the solute, as the maximum solubility depends on the solute of each solution). But, the solute content is not limited to the above-defined range and may be any value of percentage. The dry surface treatment method is not limited to those mentioned above and may use any type of gas or molecule as long as it reduces the surface energy of the oxide-based insulating substrate.

In order to decrease the number of the hydroxyl groups (—OH bonds) on the surface of the substrate and to provide nucleation sites sparsely, there may be performed a method of removing hydroxyl groups (—OH), such as a treatment method selected from the group consisting of vacuum thermal treatment, annealing, high-vacuum annealing, and a combination thereof. The method as used herein is not limited to those mentioned above and may include any method as long as it removes hydroxyl groups (—OH bonds). When the high-vacuum annealing method is used as a surface treatment for the oxide-based insulating substrate, for example, the dangling bond providing the reactive surface sites on the substrate is broken through the high-vacuum annealing, thereby reducing the number of nucleation sites. This results in the creation of the transition metal dichalcogenide crystals in a larger size, but possibly deteriorates the uniformity of the two-dimensional transition metal dichalcogenide thin film.

The above-presented illustration is limitedly applied to the oxide-based insulating substrate. In the case of a crystalline substrate or a metallic substrate, the sites having surface defects function as nucleation sites and the surface defects are controllable by the adjusting the surface energy through the surface treatment of the substrate. It is also possible in this case to provide plenty of nucleation sites through the reduction of the surface energy of the substrate.

In the preparation method for two-dimensional transition metal dichalcogenide thin film according to the present invention, the surface energy of the substrate is reduced through a surface treatment of the substrate, producing plenty of nucleation sites and thus reducing the crystal size of the transition metal dichalcogenide, to enhance the uniformity of the two-dimensional transition metal dichalcogenide thin film.

FIG. 15 presents scanning electron microscopic (SEM) images showing the results of nucleation on the surface of a $SiO_2$ substrate at varying concentrations of a potassium hydroxide (KOH) solution used for the surface treatment in the step of reducing the surface energy of the substrate in accordance with one embodiment of the present invention.

Figure 15A:
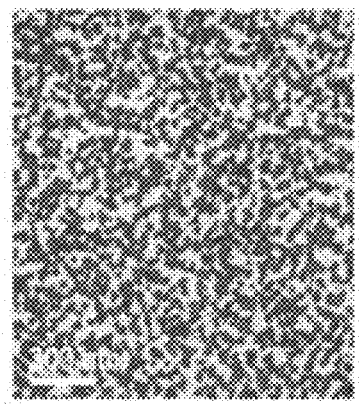
Figure 15B:
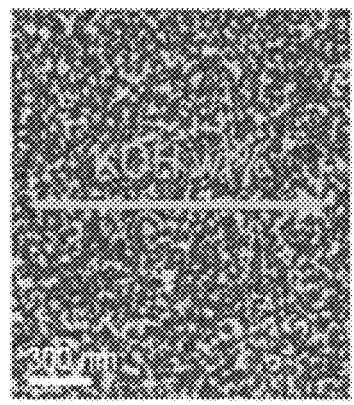
Figure 15C:
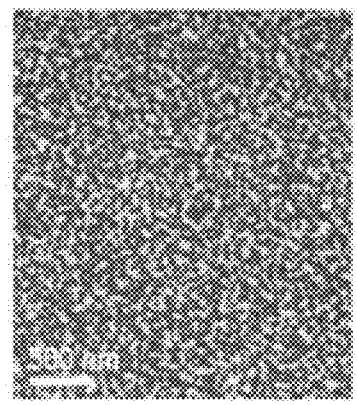

FIG. 15A is a scanning electron microscopic (SEM) image showing the results of nucleation on the surface of a $SiO_2$ substrate incurred by introducing a chalcogen-containing precursor and a transition-metal-containing precursor into a deposition chamber, without performing a surface treatment on the $SiO_2$ substrate. FIG. 15B is a scanning electron microscopic (SEM) image showing the results of nucleation on the surface of a $SiO_2$ substrate incurred by introducing a chalcogen-containing precursor and a transition-metal-containing precursor into a deposition chamber, after performing a surface treatment on the $SiO_2$ substrate with a solution containing 1 wt. % of potassium hydroxide. FIG. 15C is a scanning electron microscopic (SEM) image showing the results of nucleation on the surface of a $SiO_2$ substrate incurred by introducing a chalcogen-containing precursor and a transition-metal-containing precursor into a deposition chamber, after performing a surface treatment on the $SiO_2$ substrate with a solution containing 10 wt. % of potassium hydroxide.

As can be seen from the comparison of FIGS. 15A, 15B and 15C, without a surface treatment of the substrate, it incurs no reduction of the surface energy of the substrate, creating the nucleation sites sparsely to cause only a few occurrences of nucleation (Refer to FIG. 5A); and with a surface treatment of the substrate using a potassium hydroxide solution, the surface energy of the substrate is reduced to create plenty of nucleation sites and to incur many occurrences of nucleation (Refer to FIGS. 5B and 5C). Particularly, the higher concentration of the potassium hydroxide solution results in the production of more plenty of nucleation sites and more occurrences of nucleation.

In one embodiment of the present invention, the substrate may be selected from the group consisting of $SiO_2$, $Al_2O_3$, $HfO_2$, $LiAlO_3$, MgO, Si, Ge, GaN, AlN, GaP, InP, GaAs, SiC, glass, quartz, sapphire, graphite, graphene, plastic, polymer, boron nitride (h-BN), and a combination thereof, but is not limited to those listed above. The substrate as used herein is preferably a material inexpensive and favorable to a large-area production in the aspect of the cost. Further, a desirable substrate is a substrate having the surface energy tunable to control the number of nucleation sites.

The method for preparing a two-dimensional transition metal dichalcogenide thin film according to the present invention may include the step of introducing a chalcogen-containing precursor, a transition-metal-containing precursor, and a precursor-decomposition-accelerating catalyst into the deposition chamber to deposit a two-dimensional transition metal dichalcogenide monolayer on the substrate.

In one embodiment of the present invention, a gas phase reaction that is a homogeneous reaction, and a surface reaction on the substrate that is a heterogeneous reaction are incurred simultaneously in the deposition step (e.g. the chemical vapor deposition step). In the gas phase reaction, gaseous substances react with one another to create a cluster of the transition metal dichalcogenide, and the cluster is transferred to the surface of the substrate to incur a surface reaction. Also in the surface reaction on the substrate, gaseous substances react with one another to form a crystal of the transition metal dichalcogenide.

When a chalcogen-containing precursor and a transition-metal-containing precursor are introduced into the deposition chamber, for example, a precursor decomposition reaction for the chalcogen-containing precursor and the transition-metal-containing precursor occurs. Chalcogen atoms and transition metal atoms that are intermediate products of the decomposition of the precursors form a cluster of the transition metal dichalcogenide through a gas phase reaction. The cluster is transferred to the surface of the substrate to cause a surface reaction. On the surface of the substrate, the chalcogen-containing precursor, the transition-metal-containing precursor, and the intermediate products of the decomposition of the precursors, that is, chalcogen atoms and transition metal atoms, participate in a heterogeneous reaction to form a crystal of the transition metal dichalcogenide.

The chalcogen-containing precursor and the transition-metal-containing precursor have a precursor-specific decomposition temperature. Such a decomposition characteristic of the precursors can be a critical factor determining the synthesis temperature of the two-dimensional transition metal dichalcogenide thin film. In the synthesis of the two-dimensional transition metal dichalcogenide thin film performed at a temperature lower than the decomposition temperature of the corresponding precursors, there may occur a heterogeneous reaction to reduce the synthesis rate.

In one embodiment of the present invention, a precursor-decomposition-accelerating catalyst together with the chalcogen-containing precursor and the transition-metal-containing precursor may be introduced into the deposition chamber. The precursor-decomposition-accelerating catalyst speeds up the decomposition of the chalcogen-containing precursor to take the ligand off from the chalcogen atom in the chalcogen-containing precursor, and/or the decomposition of the transition-metal-containing precursor containing a ligand bonded to a transition metal atom to take the ligand off from the transition metal atom in the transition-metal-containing precursor. The precursor-decomposition-accelerating catalyst is outstandingly favorable in the aspect of commercialization, because it accelerates the decomposition of the precursors to enhance the synthesis rate of the two-dimensional transition metal dichalcogenide thin film even under the low temperature condition (e.g., 500° C. or below).

When the transition-metal-containing precursor is molybdenum hexacarbonyl ($Mo(CO)_6$) of which the complete decomposition temperature is 250° C., for example, the presence of hydrogen used as a precursor-decomposition-accelerating catalyst results in speeding up the reduction reaction of CO, to increase the synthesis rate of the two-dimensional transition metal dichalcogenide thin film at 250° C. several times as high as the synthesis rate acquired without the use of hydrogen, or to achieve at least the equivalent synthesis rate of the two-dimensional transition metal dichalcogenide thin film even at a lower temperature than 250° C.

In one embodiment of the present invention, the precursor-decomposition-accelerating catalyst is not limited to a gas substance like hydrogen and may include, without limitation, any catalyst available in accelerating the decomposition of the chalcogen-containing precursor containing a ligand bonded to a chalcogen atom to take the ligand off from the chalcogen atom in the chalcogen-containing precursor, and/or the decomposition of the transition-metal-containing precursor containing a ligand bonded to a transition metal atom to take the ligand off from the transition metal atom.

FIG. 16 presents scanning electron microscopic (SEM) images showing the results of the synthesis of a two-dimensional transition metal dichalcogenide thin film with/without the use of a precursor-decomposition-accelerating catalyst in the deposition step in accordance with one embodiment of the present invention.

Figure 16A:
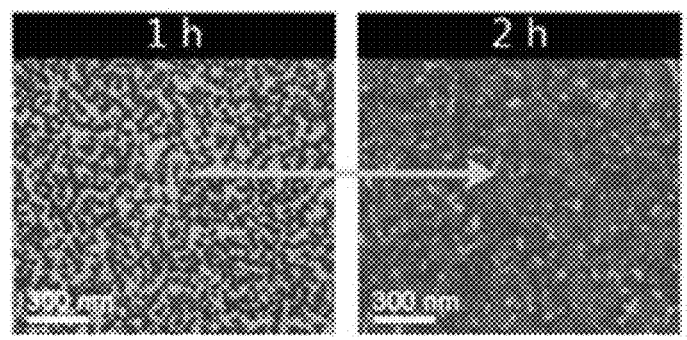
Figure 16B:
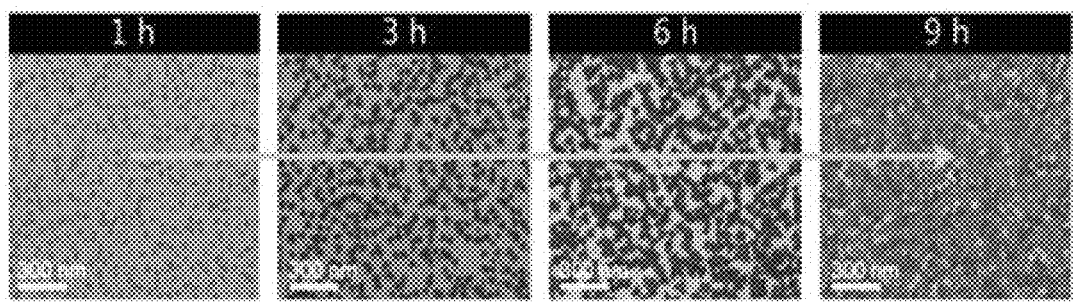

FIG. 16A is a scanning electron microscopic (SEM) image showing the results of the synthesis of a two-dimensional transition metal dichalcogenide thin film using a chalcogen-containing precursor and a transition-metal-containing precursor introduced together with hydrogen ($H_2$) used as a precursor-decomposition-accelerating catalyst into a deposition chamber in the deposition step. FIG. 16B is a scanning electron microscopic (SEM) image showing the results of the synthesis of a two-dimensional transition metal dichalcogenide thin film using a chalcogen-containing precursor and a transition-metal-containing precursor introduced without hydrogen ($H_2$) as a precursor-decomposition-accelerating catalyst into a deposition chamber in the deposition step.

As can be seen from the comparison of FIGS. 16A and 16B, without a precursor-decomposition-accelerating catalyst, the synthesis of a two-dimensional transition metal dichalcogenide thin film takes 9 hours in total; and with hydrogen ($H_2$) as a precursor-decomposition-accelerating catalyst, the synthesis of a two-dimensional transition metal dichalcogenide thin film takes 2 hours in total, so the synthesis rate is increased by 4.5 times.

In one embodiment of the present invention, an inhibitor for preventing the creation of a two-dimensional transition metal dichalcogenide bilayer may be further used in the deposition step.

Under the low temperature condition (e.g., 500° C. or below), it is easy to form a transition metal dichalcogenide bilayer, which acts as a major hindrance to the synthesis of a uniform two-dimensional transition metal dichalcogenide monolayer thin film and becomes the threshold of the synthesis at low temperature. The creation of the bilayer provides the active sites to increasing the chance of incorporating impurities, ending up deteriorating the quality of the two-dimensional transition metal dichalcogenide thin film.

FIG. 17 presents scanning electron microscopic (SEM) images [17A, 17B and 17C] and Raman spectra [17D and 17E] showing the results of the synthesis of a two-dimensional transition metal dichalcogenide thin film at varying internal temperatures of the deposition chamber.

Figure 17A:
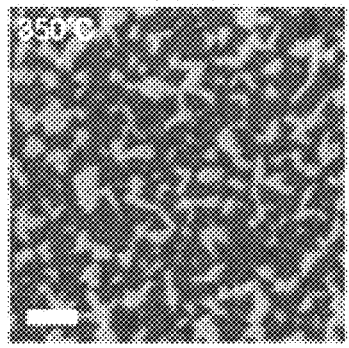
Figure 17B:
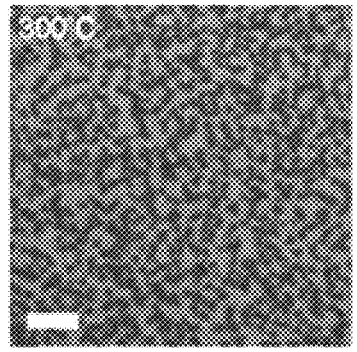
Figure 17C:
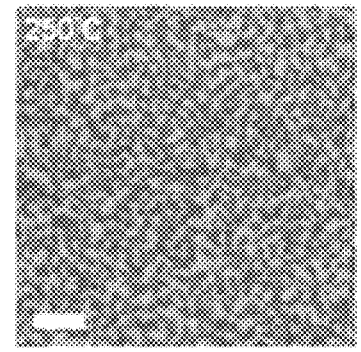

As can be seen from FIGS. 17A, 17B and 17C, when a chalcogen-containing precursor and a transition-metal-containing precursor are introduced into a deposition chamber to create nuclei of a two-dimensional transition metal dichalcogenide ($MoS_2$) on the substrate, only a few nuclei are created with the increased crystal size when the internal temperature of the deposition chamber is set to 350° C. (Refer to FIG. 17A); and the number of nuclei increases and the crystal size further decreases when the internal temperature of the deposition chamber is set to the lower temperature of 300° C. or 250° C. (Refer to FIGS. 17B and 17C).

Figure 17D:
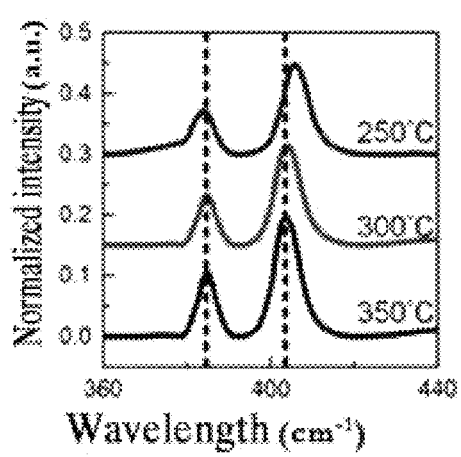
Figure 17E:
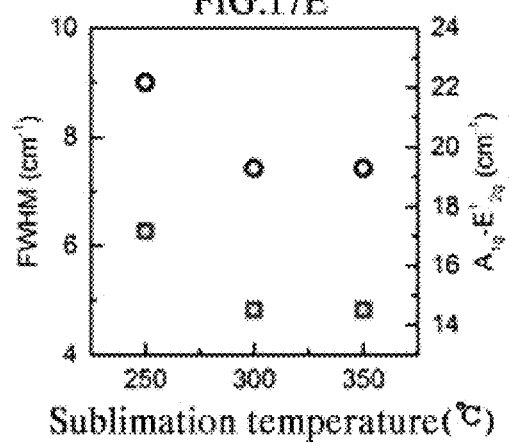

As can be seen from FIGS. 17D and 17E, Raman spectra show that the internal temperature of the deposition chamber is a determinant factor to whether a bilayer of the transition metal dichalcogenide is created or not. Generally, a transition metal dichalcogenide monolayer and a transition metal dichalcogenide bilayer are distinguished from each other by the distance between the two peaks shown in FIG. 17D [H. Li, Q. Zhang, C. C. R. Yap, B. K. Tay, T. H. T. Edwin, A. Oliver, and D. Baillargeat, "From Bulk to Monolayer $MoS_2$: Evolution of Raman Scattering", Adv. Funct. Mater., 22, 1385-1390, 2012]. As shown in FIG. 17E, the thin film is a transition metal dichalcogenide monolayer as the value of $A_{1g}$-$E^1_{2g}$ is about 19, when the internal temperature of the deposition chamber is 350° C. (FIG. 17A); and the thin film is a transition metal dichalcogenide bilayer as the value of $A_{1g}$-$E^1_{2g}$ is raised to about 22 at the reduced diffusion distance, when the internal temperature of the deposition chamber is 250° C. (FIG. 17C).

In order to prevent the creation of a bilayer that deteriorates the quality of the two-dimensional transition metal dichalcogenide thin film, according to the present invention, an inhibitor may be introduced together with the chalcogen-containing precursor, the transition-metal-containing precursor and the precursor-decomposition-accelerating catalyst into the deposition chamber; or an inhibitor may be added in a predetermined time after the introduction of the chalcogen-containing precursor, the transition-metal-containing precursor and the precursor-decomposition-accelerating catalyst into the deposition chamber.

FIG. 18 presents mimetic diagrams showing the results of the synthesis of a two-dimensional transition metal dichalcogenide thin film with/without the use of an inhibitor for preventing the creation of a two-dimensional transition metal dichalcogenide bilayer in the deposition step in accordance with one embodiment of the present invention.

Figure 18A:
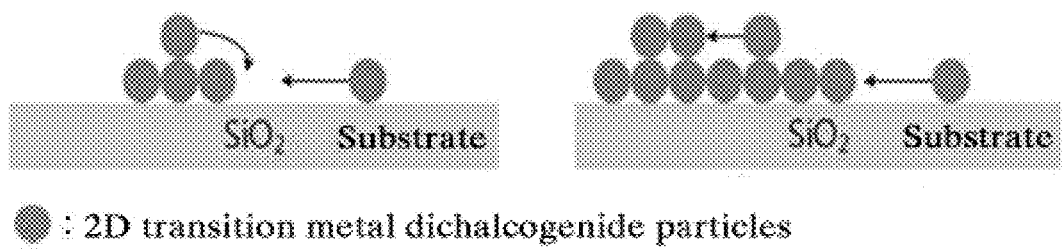

As shown in FIG. 18A, when a two-dimensional transition metal dichalcogenide thin film is synthesized under the low temperature condition (e.g., 500° C. or below) without using an inhibitor, a uniform two-dimensional transition metal dichalcogenide monolayer thin film is formed at the early stage of the synthesis, but the transition metal dichalcogenide molecules adsorbed on the two-dimensional transition metal dichalcogenide monolayer by the Van-der-Waals interaction are unable to move to the edge plane of the crystal due to the lower molecular mobility with an increase in the crystal size of the transition metal, thereby forming another nucleation sites on the two-dimensional transition metal dichalcogenide monolayer. Accordingly, a simultaneous synthesis of the two-dimensional transition metal dichalcogenide monolayer and the two-dimensional transition metal dichalcogenide bilayer takes place to form a non-uniform two-dimensional transition metal dichalcogenide thin film.

Figure 18B:
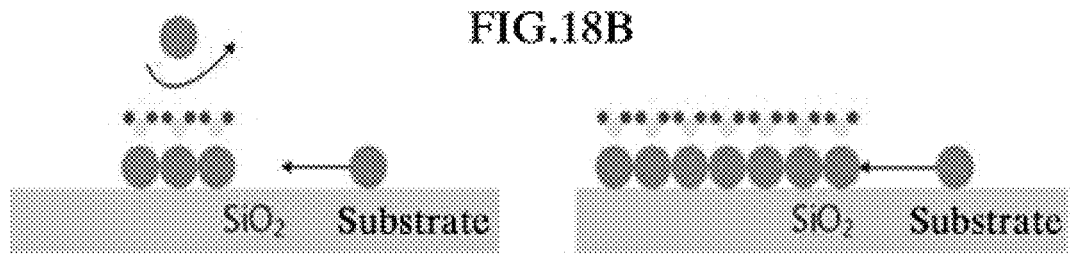

As shown in FIG. 18B, when a two-dimensional transition metal dichalcogenide thin film is synthesized under the low temperature condition (e.g., 500° C. or below) using $H_2O$ as an inhibitor, a uniform two-dimensional transition metal dichalcogenide monolayer thin film is formed at the early stage of the synthesis, but the $H_2O$ molecules used as an inhibitor are physically adsorbed on the basal plane of the two-dimensional transition metal dichalcogenide monolayer (where the basal plane of the two-dimensional transition metal dichalcogenide monolayer means the top or bottom side of the two-dimensional transition metal dichalcogenide monolayer), so the transition metal dichalcogenide molecules are unable to be adsorbed on the basal plane of the two-dimensional transition metal dichalcogenide monolayer. Accordingly, the transition metal dichalcogenide molecules form chemical bonds only on the edge plane of the two-dimensional transition metal dichalcogenide monolayer, so a two-dimensional transition metal dichalcogenide monolayer can be formed all over the substrate without the creation of a two-dimensional transition metal dichalcogenide bilayer. It is therefore possible to prepare a highly uniform two-dimensional transition metal dichalcogenide monolayer thin film when using an inhibitor introduced together with a chalcogen-containing precursor, a transition-metal-containing precursor, and a precursor-decomposition-accelerating catalyst into the deposition chamber.

A substance available as an inhibitor for preventing the creation of a two-dimensional transition metal dichalcogenide bilayer may include, but is not limited to, any substance that is capable of being adsorbed on the basal plane of the two-dimensional transition metal dichalcogenide monolayer. For example, $H_2O$ may be used as an inhibitor.

In one embodiment of the present invention, the inhibitor preferably meets the following requirements.

The inhibitor has an adsorption energy higher on the edge planes of the substrate and the transition metal dichalcogenide monolayer rather than on the basal plane of the two-dimensional transition metal dichalcogenide monolayer. The chalcogen has an adsorption energy higher on the basal planes of the substrate and the transition metal dichalcogenide monolayer than on the edge plane of the transition metal dichalcogenide monolayer.

FIG. 19 presents scanning electron microscopic (SEM) images showing the results of the synthesis of a two-dimensional transition metal dichalcogenide thin film with/without the use of an inhibitor for preventing the creation of a two-dimensional transition metal dichalcogenide bilayer in the deposition step in accordance with one embodiment of the present invention.

Figure 19A:
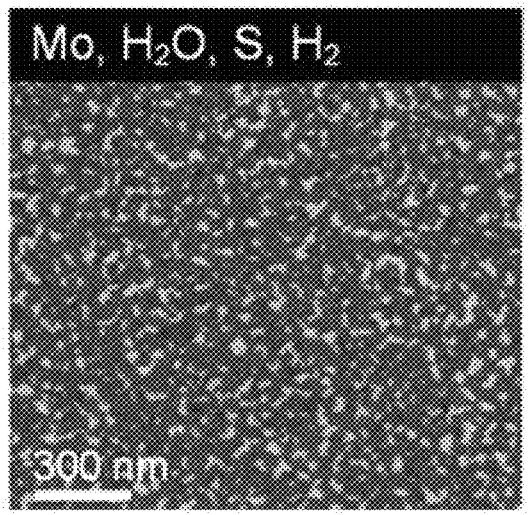

As shown in FIG. 19A, when the synthesis of a two-dimensional transition metal dichalcogenide thin film is performed in the deposition step under the low temperature conditions (e.g., 500° C. or below) using $H_2O$ as an inhibitor, a chalcogen-containing precursor (e.g., an S-containing precursor), a transition-metal-containing precursor (e.g., a Mo-containing precursor), and a precursor-decomposition-accelerating catalyst (e.g., $H_2$ gas) in a deposition chamber, it creates mostly a two-dimensional transition metal dichalcogenide monolayer (in gray) and scarcely a two-dimensional transition metal dichalcogenide bilayer (in black) to form a uniform two-dimensional transition metal dichalcogenide thin film.

Figure 19B:
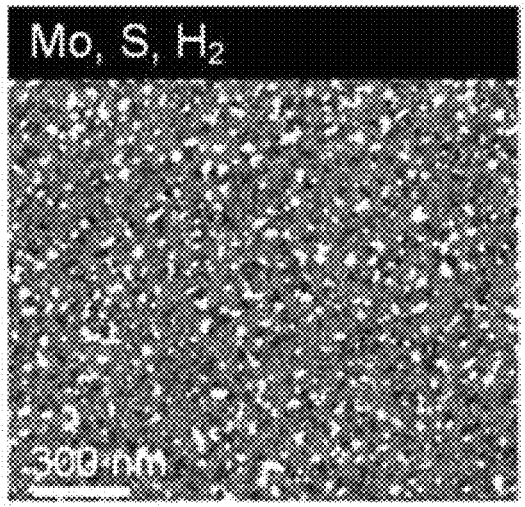

As shown in FIG. 19B, when the synthesis of a two-dimensional transition metal dichalcogenide thin film is performed in the deposition step under the low temperature condition (e.g., 500° C. or below) using a chalcogen-containing precursor (e.g., an S-containing precursor), a transition-metal-containing precursor (e.g., a Mo-containing precursor), and a precursor-decomposition-accelerating catalyst (e.g., $H_2$ gas) without $H_2O$ as an inhibitor in a deposition chamber, it creates a two-dimensional transition metal dichalcogenide monolayer (in gray) and plenty of two-dimensional transition metal dichalcogenide bilayers (in black) in a simultaneous manner to form a non-uniform two-dimensional transition metal dichalcogenide thin film.

On the other hand, the present invention is directed to a method for preparing a two-dimensional transition metal dichalcogenide thin film that includes: (1) performing a surface treatment on a substrate in a deposition chamber to reduce the surface energy of the substrate; (2) introducing a chalcogen-containing precursor and a transition-metal-containing precursor into the deposition chamber at a temperature of 500° C. or below and a first pressure of 0.001 to 760 Torr to create crystals of the two-dimensional transition metal dichalcogenide on the substrate; (3) introducing the chalcogen-containing precursor and the transition-metal-containing precursor into the deposition chamber at a second pressure higher than the first pressure of the step (2) to increase the crystal size of the two-dimensional transition metal dichalcogenide on the substrate; and (4) introducing the chalcogen-containing precursor and the transition-metal-containing precursor into the deposition chamber at a third pressure higher than the second pressure of the step (3) to form a two-dimensional transition metal dichalcogenide monolayer on the substrate.

In the steps (2), (3) and (4), the precursor-decomposition-accelerating catalyst may be added together with the chalcogen-containing precursor and the transition-metal-containing precursor into the deposition chamber.

In the steps (2), (3) and (4), an inhibitor for preventing the creation of the two-dimensional transition metal dichalcogenide bilayer may be added into the deposition chamber, together with a chalcogen-containing precursor and a transition-metal-containing precursor, or together with a chalcogen-containing precursor, a transition-metal-containing precursor and a precursor-decomposition-accelerating catalyst. The inhibitor may be introduced together with a chalcogen-containing precursor, a transition-metal-containing precursor and a precursor-decomposition-accelerating catalyst into the deposition chamber in a simultaneous manner. Otherwise, the inhibitor may be added in a predetermined time after the introduction of a chalcogen-containing precursor, a transition-metal-containing precursor and a precursor-decomposition-accelerating catalyst into the deposition chamber.

Hereinafter, a detailed description of what is already specified above will be omitted. The steps (2), (3) and (4) may be the specific processes of the deposition step to form a two-dimensional transition metal dichalcogenide monolayer.

Generally, with a decrease in the number of nucleation sites on the surface of the substrate, a two-dimensional transition metal dichalcogenide thin film having a larger crystal size is synthesized, but its uniformity deteriorates. In contrast, with an increase in the number of nucleation sites, a two-dimensional transition metal dichalcogenide thin film having a smaller crystal size is synthesized, but with enhanced uniformity.

In one embodiment of the present invention, there is provided a method for preparing a two-dimensional transition metal dichalcogenide thin film with a large crystal size and enhanced uniformity under the low temperature condition.

Firstly, a nucleation is induced for a predetermined time under the conditions to create plenty of nuclei on the surface of the substrate. For this purpose, the method may include a step of reducing the surface energy of the substrate through a surface treatment of the substrate in a deposition chamber. The reduction of the surface energy of the substrate through the surface treatment of the substrate is to increase the number of nucleation sites on the surface of the substrate.

Subsequently, a chalcogen-containing precursor and a transition-metal-containing precursor, together with an unselective precursor-decomposition-accelerating catalyst and an unselective inhibitor, are introduced into the deposition chamber at a temperature of 500° C. or below and a pressure of 0.001 Torr to 760 Torr to form a crystal of a two-dimensional transition metal dichalcogenide. With this, a number of nuclei are enabled to grow on the surface of the substrate, even though the crystal size is small in the early stage of the synthesis.

At the same temperature of the crystallization step and a raised pressure, the chalcogen-containing precursor and the transition-metal-containing precursor, together with an unselective precursor-decomposition-accelerating catalyst and an unselective inhibitor, are introduced into the deposition chamber to increase the crystal size of the two-dimensional transition metal dichalcogenide on the substrate. The raised pressure, higher than the pressure of the crystallization step, is a synthesis condition for the created small-sized nuclei to grow in a larger crystal size. The raised pressure is higher than the pressure of the crystallization step, and the upper limit of the pressure increment is not specifically defined. With such a variation of the pressure, it is possible to grow small-sized nuclei to a larger crystal size.

When the internal pressure of the deposition chamber is 3 Torr in the crystallization step, for example, it may be raised to 9 Torr in the step of increasing the crystal size. Here, the pressure increment is not specifically limited.

FIG. 20 presents scanning electron microscopic (SEM) images showing the results of the synthesis of a two-dimensional transition metal dichalcogenide thin film at varying pressures in the deposition chamber in accordance with one embodiment of the present invention.

Figure 20A:
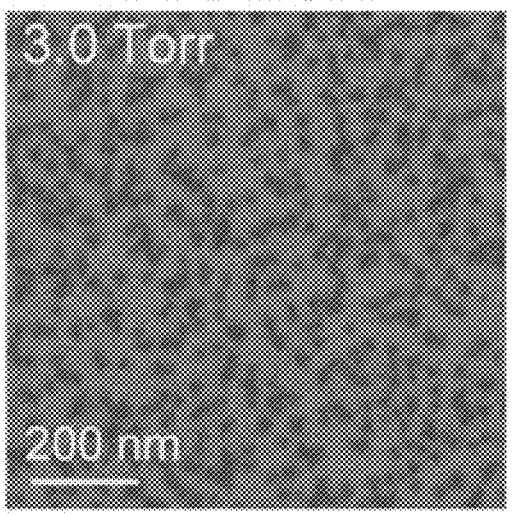
Figure 20B:
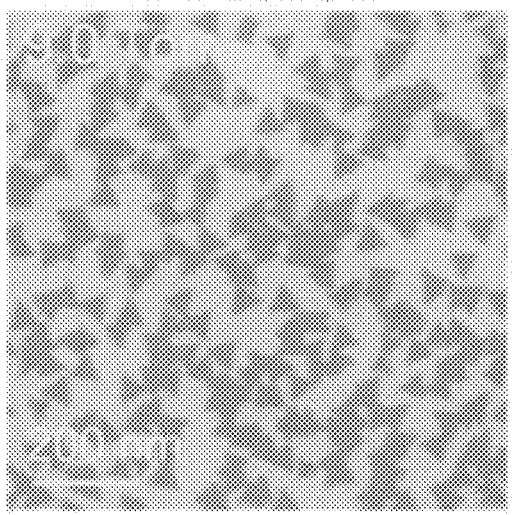

As shown in FIG. 20A, when a chalcogen-containing precursor and a transition-metal-containing precursor are introduced into a deposition chamber at the internal pressure of 3 Torr to create nuclei of a two-dimensional transition metal dichalcogenide ($MoS_2$), the crystal size decreases with the increasing number of nuclei. In contrast, as shown in FIG. 20B, when a chalcogen-containing precursor and a transition-metal-containing precursor are introduced into a deposition chamber at the internal pressure of the 9 Torr to create nuclei of a two-dimensional transition metal dichalcogenide ($MoS_2$), the crystal size increases with the decreasing number of nuclei.

At the same temperature of the crystal-size-increasing step and a raised pressure, the chalcogen-containing precursor and the transition-metal-containing precursor, together with an unselective precursor-decomposition-accelerating catalyst and an unselective inhibitor, are introduced into the deposition chamber to form a two-dimensional transition metal dichalcogenide monolayer on the substrate. The raised pressure, higher than the pressure of the crystal-size-increasing step, is a synthesis condition for the grown nuclei having a large crystal size to grow into a uniform two-dimensional transition metal dichalcogenide monolayer. The condition is that the raised pressure is higher than the pressure of the crystal-size-increasing step, and the upper limit of the pressure increment is not specifically defined. With such a variation of the pressure, it is possible to prepare a two-dimensional transition metal dichalcogenide monolayer thin film with enhanced uniformity.

In one embodiment of the present invention, the preparation method of the present invention controls the size of a crystal or cluster of a two-dimensional transition metal dichalcogenide and the number of nucleation sites to prepare a large-area two-dimensional transition metal dichalcogenide thin film with high quality and enhanced uniformity at a low temperature of about 500° C. or below and thereby to manufacture a device with good electrical performance using the two-dimensional transition metal dichalcogenide thin film.

Hereinafter, the disclosure of the present invention will be described in further detail with reference to the examples of the present invention and the comparative examples test, which are given for the understanding of the disclosure of the present invention and not intended to limit the scope of the present invention.

EXAMPLES

Growth Process

A two-dimensional transition metal dichalcogenide, $MoS_2$, was grown using a transition-metal-containing precursor, $Mo(CO)_6$ (=99.9%, Sigma Aldrich, CAS number 13939-06-5), in a showerhead type reactor. Highly doped (<0.005 Ω·cm) p-type Si with a $SiO_2$ layer having a thickness of 300 nm was used as a substrate. The substrate was pre-cleaned and, in a short time, placed on a silicon carbide (SiC)-coated susceptor in a load-lock chamber for the prevention of any contamination from the surrounding environments. The heating block in the CVD was preheated to 350° C. prior to the growth. The susceptor with the substrate was transferred to the reactor, and the temperature of the substrate was raised for 10 minutes in the stream of argon (Ar). The growth was performed merely with $H_2S$ and the sublimated precursors at a constant pressure of 0.5 Torr for a predetermined growth time. After completion of the growth, the substrate was transferred to the load-lock chamber and cooled down in the stream of argon (100 sccm) for one hour. The treatment after the growth was not performed by known methods (e.g., Ar and $H_2S$ annealing at high temperature). The grown sample was used in all the analyses and characteristic analyses.

AFM Measurement

The two-dimensional transition metal dichalcogenide was measured with an AFM (XE-150, Park Systems) in regards to surface profile, grain size, nucleation, and growth. For a Better quality, the AFM images were measured with a very sharp silicone tip having the radius of curvature of 5 nm or less (<5 nm). A soft X-ray ionizer module was adopted in order to prevent static electricity during the measurement. The images were taken at a resolution of 512×512 pixels and a rate of 0.5 Hz over the domain of 1 to 2 μm$^2$ and adjusted to 750 nm$^2$.

Spectroscopic Measurement

The Raman spectroscopic measurement of the two-dimensional transition metal dichalcogenide prepared in the examples was performed with a DXR Raman microscope (Thermo Scientific), which used a laser excitation wavelength of 532 nm, a spot size of 0.7 μm, and a power of 8 mW. The approximate spectrum resolution was 0.5 cm$^{-1}$, and a Si peak of 520.8 cm$^{-1}$ was used for normalization. The photoluminescence measurement (LabRam ARAMIS, Horiba Jobin Yvon) of the grown sample was carried out at wavelength of 514 nm and laser power of 10 mW. The ellipsometry mapping measurement was performed with a step size of 0.5 cm. The thickness results were extracted through a multilayer modeling system (four-layer model, air/$MoS_2$/$SiO_2$/Si). The XPS measurement (SES-100, VG-SCIENTA) used a light source of non-monochromatic magnesium Kα under the ultrahigh vacuum condition (<10$^{-8}$ Torr).

Preparation of TEM Sample

A 60-second spin coating of poly(methyl methacrylate) (PMMA) (950 A2, McroChem) was performed at 4,000 rpm on the grown $MoS_2$/$SiO_2$/Si sample. The coated sample was dipped in a buffered oxide etching (BOE) solution (6:1, J. T. Baker) to etch the $SiO_2$ layer. The separated PMMA/$MoS_2$ was washed with deionized water several times and simply placed on a carbon grid (HC300-CU, Electron Microscopy Sciences). The PMMA was removed through annealing at 300° C. for 30 minutes under the ultrahigh vacuum condition (<10$^{-5}$ Torr).

HAADF-STEM Image Measurement

The HAADF-STEM images of the two-dimensional transition metal dichalcogenide prepared in the examples were taken with a Cs-STEM (Titan cubed G2 60-300, FEI) operated at 300 kV using a convergence angle of 19.3 mrad and a screen current of 50-100 pA. The images were subjected to equalization and Fourier filtration in order to enhance the contrast.

Measurement of Electrical Performance

A Ti/Au (5/50 nm) electrode was deposited directly on the grown $MoO_2$ monolayer using the electron-beam deposition method to manufacture a back-gate FET device. The electrode was patterned using the electron-beam lithography of PMMA (950 C4, MicroChem) and developed with a diluted MIBK solution (MIBK:IPA=1:1, MicroChem). For a lift-off process, the device was dipped in dichloromethane (DCM) and IPA and dried with highly pure $N_2$ (99.999%). The performance of the device was measured with an in-house four-probe station equipped with a precise semiconductor parameter analyzer (4156A, Hewlett-Pcckard) at the room temperature under the atmospheric conditions. The device was not subjected to annealing.

Figure 1A:
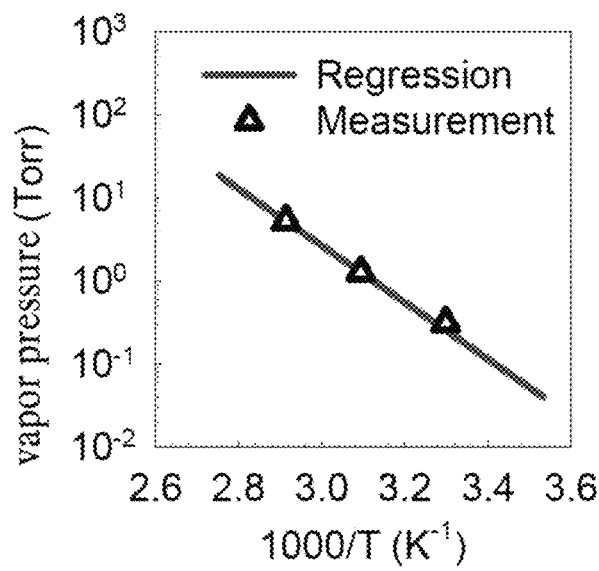
FIGS. 1A and 1B are a graph showing the vapor pressure as a function of the temperature of a transition-metal-containing precursor of the two-dimensional transition metal dichalcogenide and an FT-IR graph showing the decomposition characteristic of the two-dimensional transition metal dichalcogenide in accordance with one embodiment of the present invention, respectively.
Figure 1B:
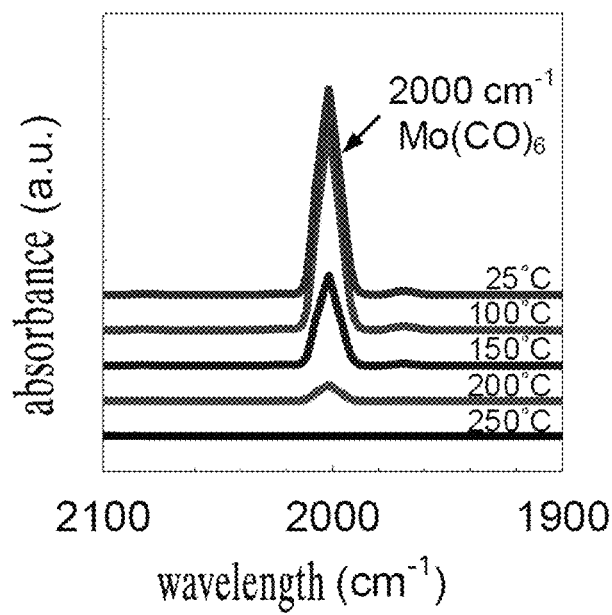

Vapor Pressure and Decomposition Characteristic of Transition-Metal-Containing Precursor The vapor pressure and the decomposition characteristics of a precursor are determinant parameters in determining the eligibility of the precursor for a CVD process. For the measurement of the vapor pressure, a self-customized measurement system was used. A vessel of a specific volume was maintained under the high vacuum condition by a turbomolecular pump (PMP). Then, a quartz tube containing the precursor was opened and kept for several hours until it was maintained at a constant pressure. The vapor pressure of $Mo(CO)_6$ was 0.31 Torr, 1.27 Torr, and 5.24 Torr at precursor temperature of 30° C., 50° C., and 70° C., respectively, [Refer to FIG. 1A], and analyzed according to the simplified form of the Clapeyron Equation, $ln(P_{sat}/Pa)=A-B/(T/K)$, where $P_{sat}$ is the saturated vapor pressure; and T is the precursor temperature. The decomposition characteristic of $Mo(CO)_6$ was evaluated using an FT-IR spectrometer (Nicolet 6700, Thermo Scientific). The principal absorption peaks of $Mo(CO)_6$ appeared at 2,000 $cm^{-1}$, which was identical to the wavelength for those in the conventional researches. The precursor was completely decomposed at a temperature of about 250° C. and a pressure of 0.5 Torr [Refer to FIG. 1B]. Such characteristics as high vapor pressure and low decomposition temperature proved the precursor, $Mo(CO)_6$, to be eligible for the low temperature CVD process.

CVD Setup

Figure 2A:
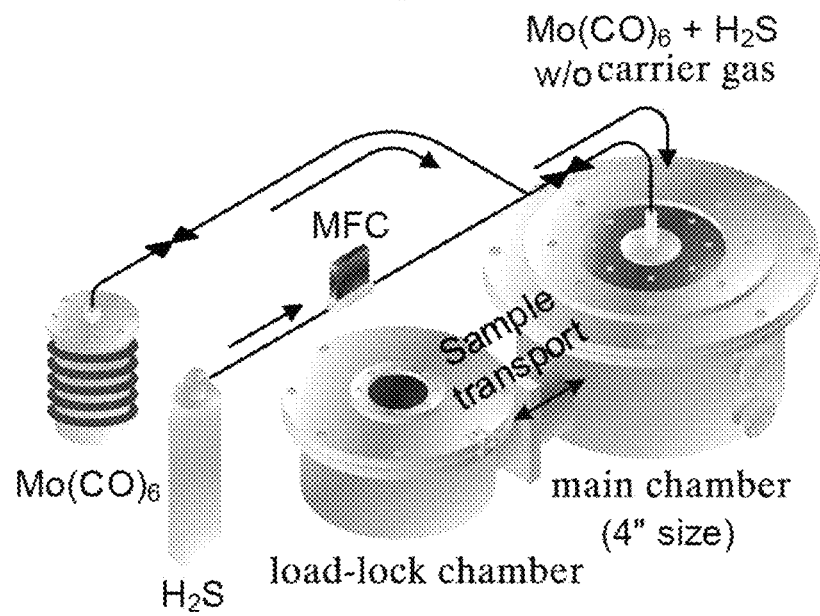
FIGS. 2A and 2B are mimetic diagrams showing a showerhead type reactor connected to a gas flow line and a load-lock chamber for deposition of a two-dimensional transition metal dichalcogenide.
Figure 2B:
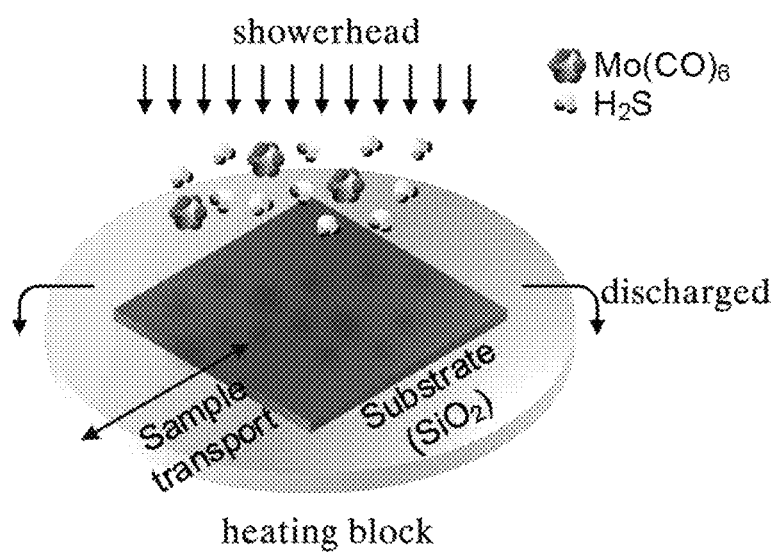
Figure 3A:
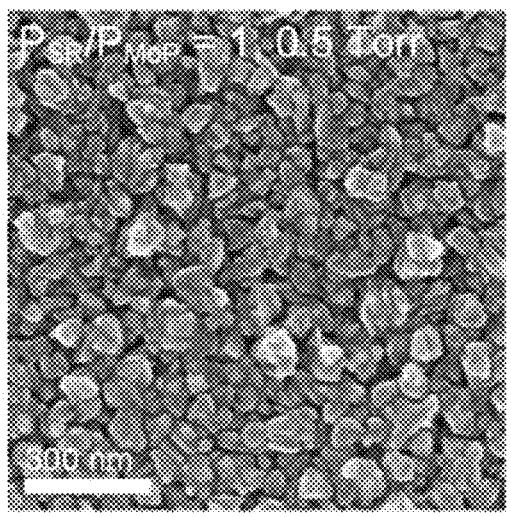
FIGS. 3A to 3D are microscopic images [3A, 3B and 3C] and a Raman spectrum [3D] of the two-dimensional transition metal dichalcogenide at varying partial pressure ratios ($P_{SR}/P_{MoP}$) of a sulfur-containing precursor to a molybdenum-containing precursor in accordance with one embodiment of the present invention, respectively.
Figure 3B:
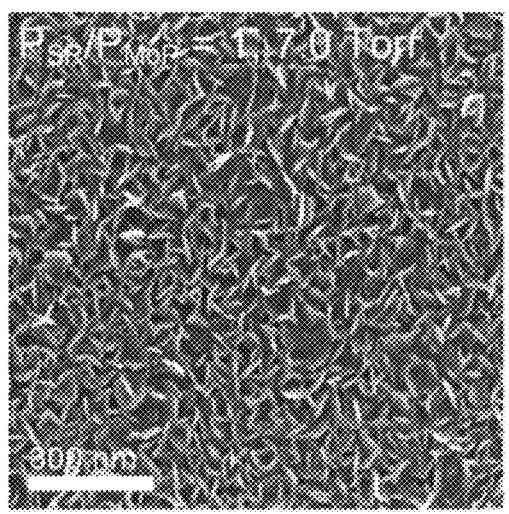
Figure 3C:
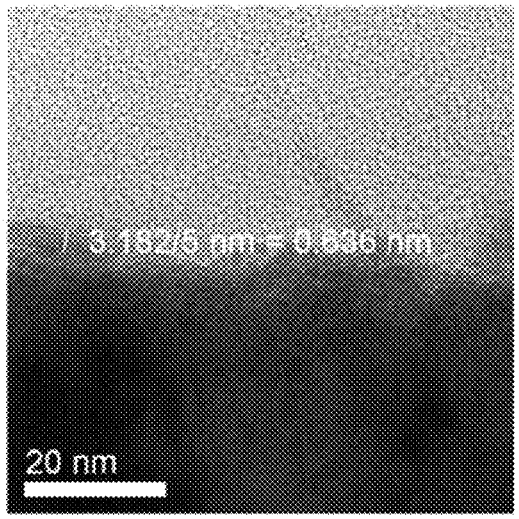
Figure 3D:
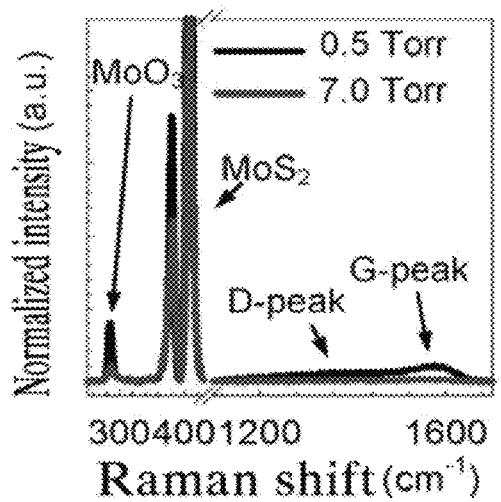

The low temperature growth process of a two-dimensional transition metal dichalcogenide, epitaxial $Mo(CO)_6$, was performed using a showerhead type reactor connected to a gas flow line and a load-lock chamber, as shown in FIGS. 2(a) and 2(b). The pre-cleaned or pretreated (using piranha or high vacuum annealing) $SiO_2$ substrate was placed in the load-lock chamber and the sample was then transferred to a main chamber. The partial pressure of $Mo(CO)_6$ was precisely controlled with a cooler-heater unit (the tunable range was −20° C. to 80° C.). The flow of $H_2S$ was controlled with a mass flow rate controller. In order to prevent the creation of a large-sized cluster, the use of a carrier gas (e.g., Ar or $H_2$) was excluded.

Example 1: Growth Analysis of Transition Metal Dichalcogenide at Varying $P_{SR}/P_{MoP}$ Values As shown in FIG. 3, the $MoS_2$ grown at varying partial pressure ratios of the sulfur-containing precursor to the molybdenum-containing precursor was evaluated using scanning electron microscopy (SEM, S-48000, HITACHI), high-resolution transmission electrode microscopy (HR-TEM, Tecnai G2 F30 S-Twin, FEI), and Raman spectroscopy. A large-sized three-dimensional $MoS_2$ was grown with a large cluster created by the gas phase reaction. As a result, the grown $MoS_2$ ($P_{SR}/P_{MoP}=1$, 0.5 Torr) was incorporated with a large amount of carbides and oxides, according to the analysis through the Raman spectroscopy (285 $cm^{-1}$ for oxides and 1350 and 1580 $cm^{-1}$ for carbides). In the $MoS_2$ grown in the raised pressure condition, peaks for $MoO_3$ and $MoS_2$ other than carbides appeared. With an increase in the chamber pressure, the partial pressure of $Mo(CO)_6$ was reduced, but that of $H_2S$ was not. Accordingly, there was an increase in the $P_{SR}/P_{MoP}$ value, which induced the creation of a small-sized cluster. This preliminary experiment showed the effect of the partial pressure ratio on the structural change with a tunable cluster size and the feasible decarbonylation method.

<1-2: $MoS_2$ Edge Type, Sulfur Coverage, and Related S-to-Mo Ratio>

It is known that two types (Mo and S edges) of the edge structure are formed under various conditions. The sulfur coverage according to the parameters related to the created edge type and the S-to-Mo ratio explain the triangular monolayer domain occasionally found in high-quality $MoS_2$. A perfect, regular triangular domain exists in an S-edged two-dimensional $MoS_2$ cluster covered with 100% sulfur. Such a structure is occasionally found under the highly sulfiding condition. In FIG. 4, the calculated S-to-Mo ratio is expressed as a function of the cluster size for different edge types and sulfur coverages. According to the XPS measurement results and the ARM images of the grown $MoS_2$ at varying $P_{SR}/P_{MoP}$, a higher $P_{SR}/P_{MoP}$ value leads to a reduction of the surface energy, making the two-dimensional growth easier.

<1-3: Growth Mechanism of Transition Metal Dichalcogenide at Varying $P_{SR}/P_{MoP}$ Values>

Figure 6A:
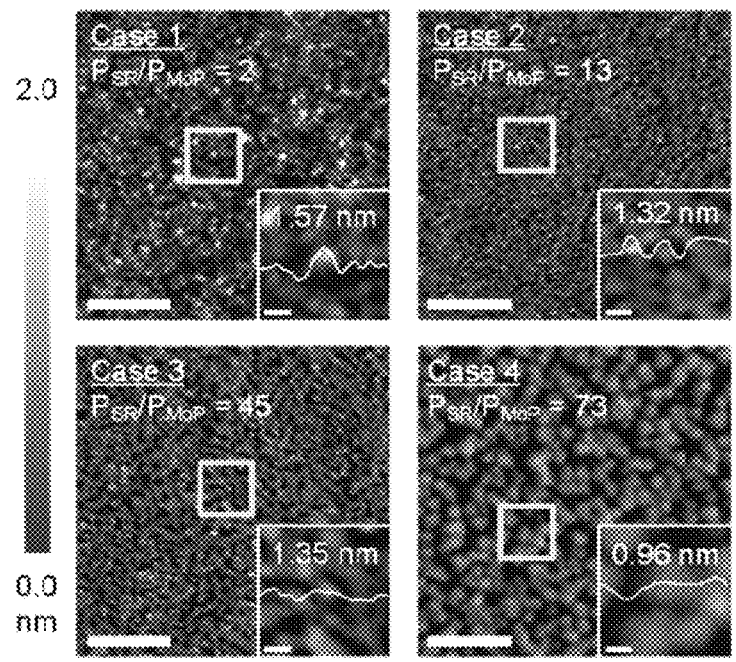
Figure 6B:
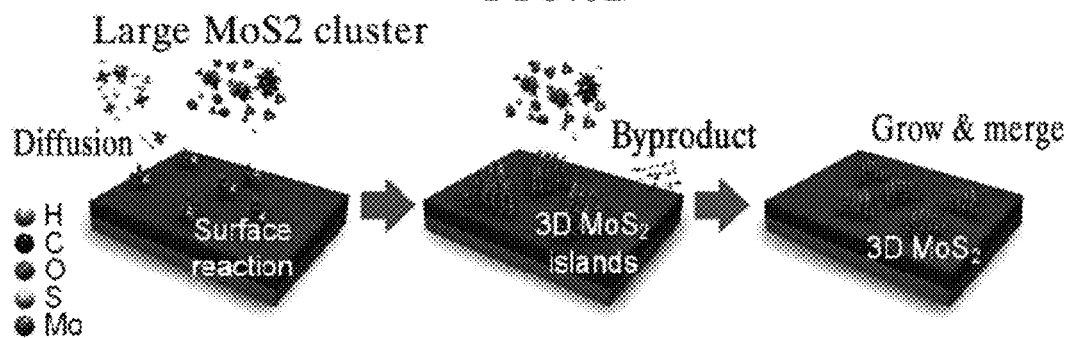
Figure 6C:
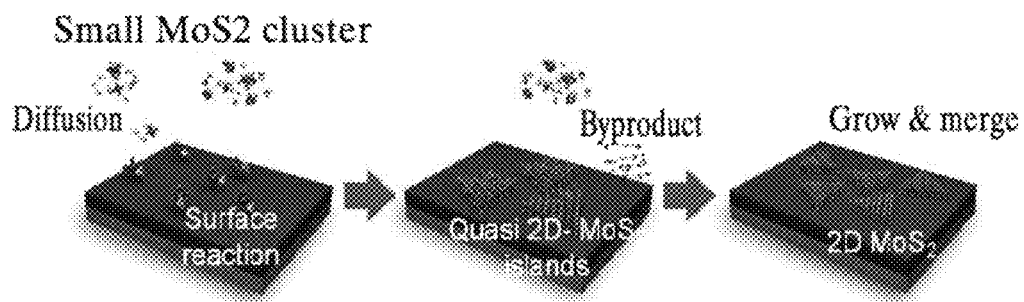

FIGS. 5a and 5b are microscopic images (FIG. 5b) of samples grown at varying $P_{SR}/P_{MoP}$ Values showing the growth window (FIG. 5a) at low temperatures. The triangular two-dimensional $MoS_2$ domain was grown at a specific $P_{SR}/P_{MoP}$ Value of 73. The scale bar was 200 nm. FIG. 6(a) shows AFM images of $MoS_2$ having different structures (3D structure: cases 1 and 2, 3D plus 2D structure: case 3, and 2D structure: case 4) grown at varying $P_{SR}/P_{MoP}$ Values. The scale bar was 200 nm. The measured height profiles of the domain are shown in the inserted diagrams of the yellow-colored open box. FIGS. 6A, 6B and 6C are schematic diagrams showing the cluster size control mechanism of the present invention. The creation of a cluster was restrained at higher $P_{SR}/P_{MoP}$ Value (FIG. 6C), while a larger $MoS_2$ cluster was formed by the gas phase reaction at lower $P_{SR}/P_{MoP}$ Value (FIG. 6B).

Figure 6D:
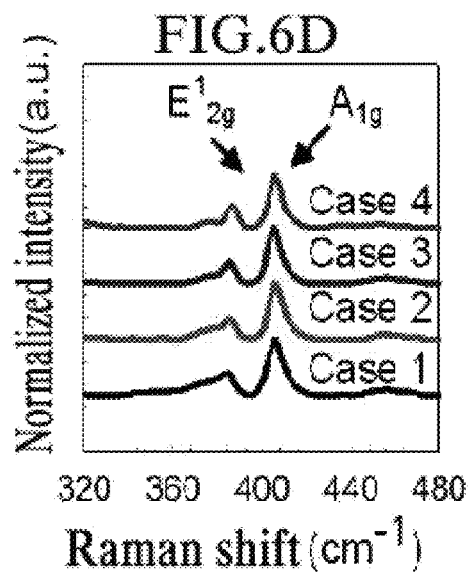
Figure 6E:
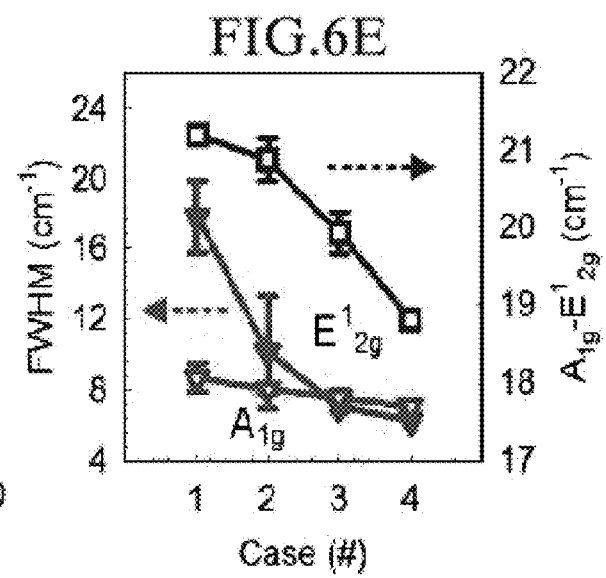
Figure 6F:
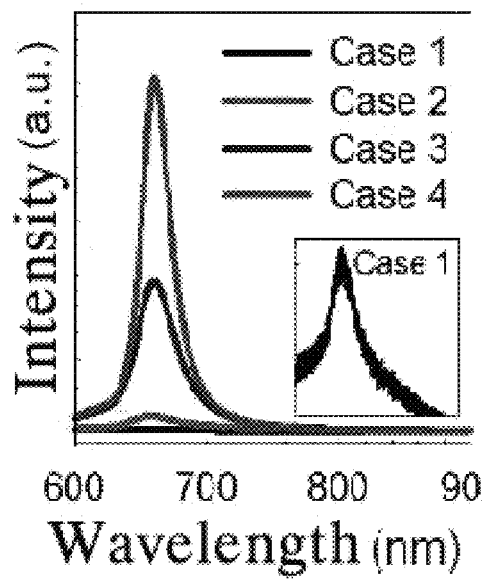
Figure 6G:
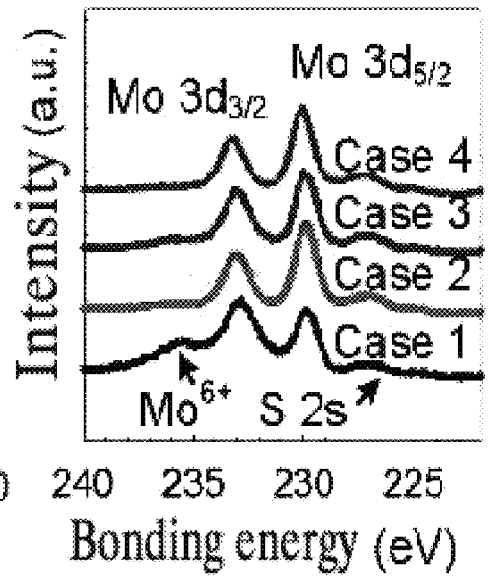
Figure 6H:
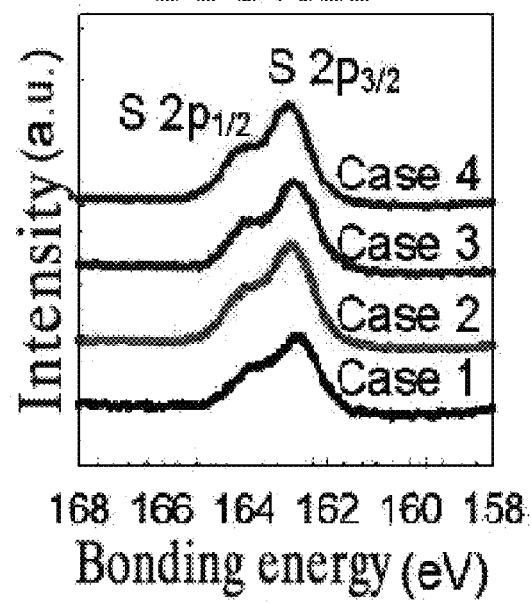

FIGS. 6D and 6E were in agreement with the Raman spectrum of each sample. The value of Δk was decreased from 21.7 $cm^{-1}$ to 18.8 $cm^{-1}$ at $P_{SR}/P_{MoP}$ of 73 (FIG. 6D). The two predominant modes had FWHM reduced from 17.84 to 6.27 $cm^{-1}$ ($E^1_{2g}$) and from 8.68 to 6.75 $cm^{-1}$ ($E^1_{2g}$), respectively (FIG. 6E). The silicon peak (520.8 $cm^{-1}$) was used for normalization. FIG. 6F is the photoluminescence spectrum of each sample. The higher intensity represents the grown $MoS_2$ of higher quality. FIGS. 6G and 6H are XPS spectra of the individual samples. The existence of $MO^{+6}$ in the case 1 indicates that an oxide was incorporated with Mo.

Example 2: Growth Analysis of Transition Metal Dichalcogenide by High Vacuum Annealing As shown in FIG. 7, the growth process on different substrates for varying growth times was observed with an AFM ($P_{SR}/P_{MoP}=146$). For this treatment, a bare $SiO_2$ substrate was washed with acetone, IPA, and deionized water, in sequence. Then, the substrate was dipped in a piranha solution for 10 minutes in order to hydroxylate the dangling bonds and then washed with deionized water. The bare $SiO_2$ substrate was annealed at 750° C. in the high vacuum condition (<$10^{-5}$ Torr) for 140 minutes in order to depassivate the hydrogen-passivated dangling bonds. More plenty of $MoS_2$ nuclei were observed at the nucleation sites on the piranha-treated substrate rather than on the other two substrates, and the creation of new nucleation sites did not occur during the growth. But, the $MoS_2$ nuclei adhered to the edge of the pre-grown $MoS_2$. Due to such a growth mechanism, the increase of the grain size was achieved by restraining the number of nucleation sites at low temperatures. The grain size of the $MoS_2$ grown on the other substrates was 50 nm (on piranha-treated $MoS_2$), 70 nm (on bare $MoS_2$), and 100 nm (on high-vacuum annealed $MoS_2$). The restraint of the nucleation site marginally retarded the growth time for the completely covered monolayer. The scale bar was 100 nm. FIGS. 8A, 8B and 8C are AFM images of the $MoS_2$ monolayer domain grown on varying substrates: FIG. 8A piranha-treated $MoS_2$, FIG. 8B bare $MoS_2$, and FIG. 8C high-vacuum annealed $MoS_2$. The high vacuum annealing process depassivated the passivated dangling bonds on the bare $MoS_2$ substrate, while the piranha treatment process passivated the dangling bonds. A large-sized domain (island) was grown on the high-vacuum-annealed $MoS_2$ substrate due to the restrained nucleation site. The growth time was 12 hours and the $P_{SR}/P_{MoP}$ value was 314. The scale bar was 100 nm.

Example 3: Expitaxy of Transition Metal Dichalcogenide

<3-1: Growth of Epitaxial Transition Metal Dichalcogenide>

Figure 9D:
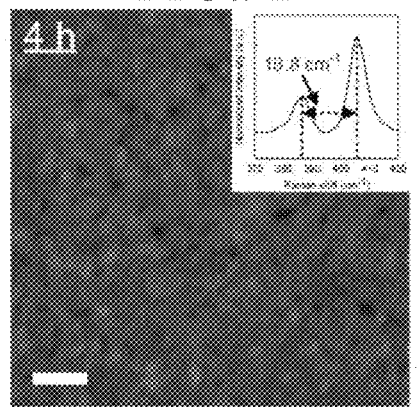
Figure 9E:
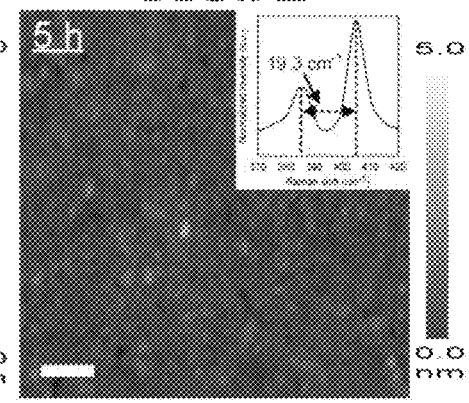
Figure 9F:
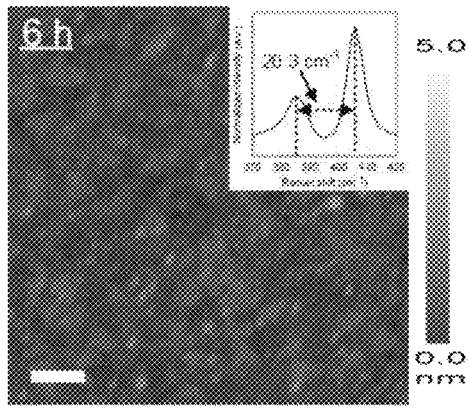
Figure 11A:
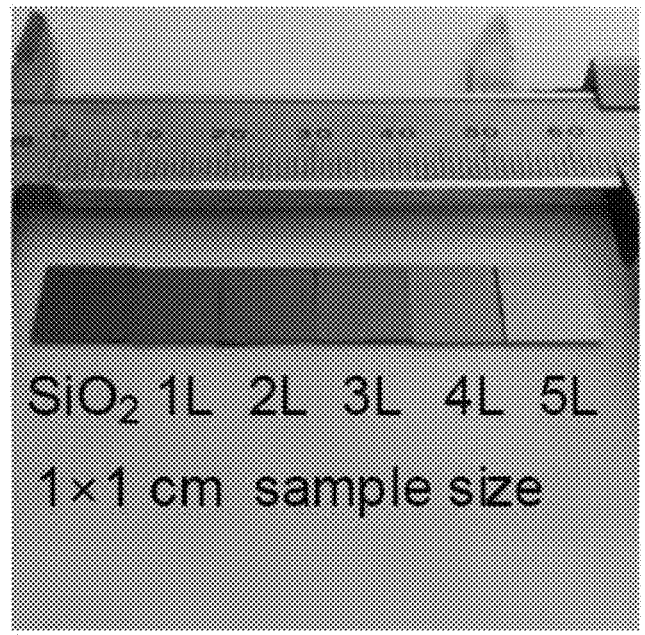
Figure 11B:
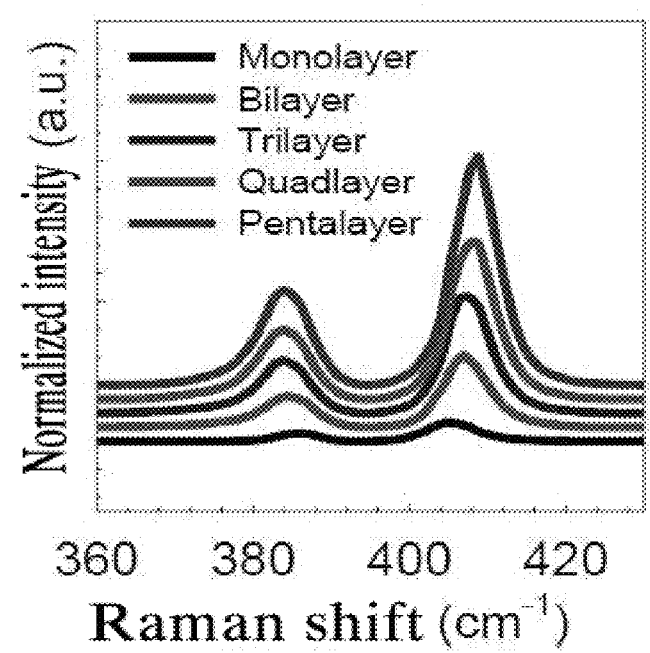
Figure 11C:
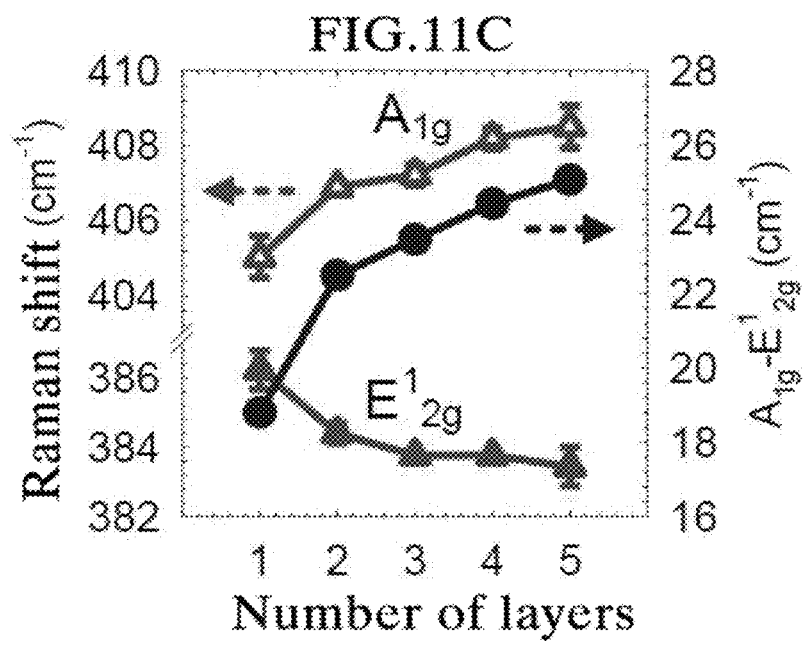
Figure 11D:
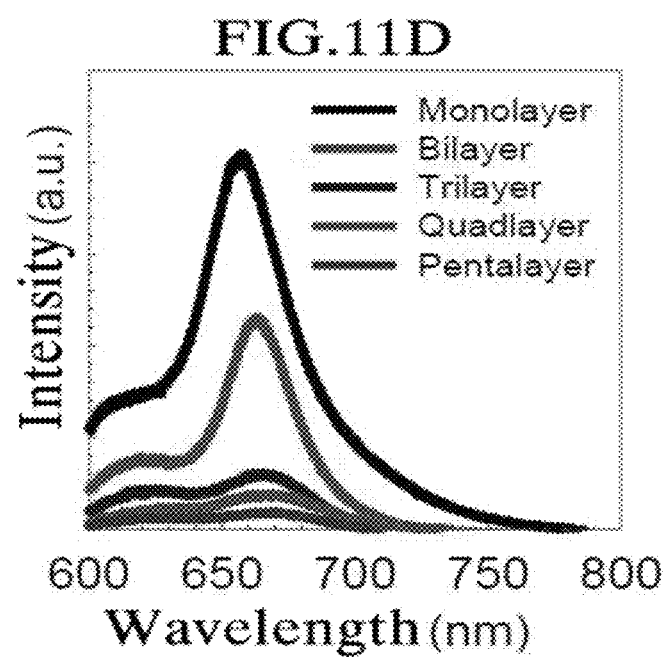

FIG. 9A shows the early phase of the growth. A small triangular domain of the $MoS_2$ monolayer was grown at the nucleation site on the $SiO_2$ substrate. In FIGS. 9B, 9C and 9D, the $MoS_2$ domain grew more so that the polycrystalline $MoS_2$ monolayers combined together. In FIGS. 9E and 9F, a triangular $MoS_2$ bilayer domain was grown on the completely covered monolayer. In the Raman spectrum for each growth time, the ΔK value was 18.8 $cm^{-1}$ and 19.3 to 20.3 $cm^{-1}$ for the monolayer and the monolayer having a bilayer domain, respectively. In the intermediate phase between the completely covered monolayer and the bilayer, the average ΔK value was 18.8 $cm^{-1}$ and 22.4 $cm^{-1}$ for the completely covered $MoS_2$ monolayer and the bilayer, respectively. The scale bar was 100 nm. FIG. 11A presents images of the $MoS_2$ monolayer, bilayer, trilayer, quadlayer, and pentalayer, grown on a bare $SiO_2$ substrate and a 1×1 $cm^2$ $SiO_2$ substrate. The layer was controlled according to the growth time, and the other conditions were fixed. FIGS. 11B and 11C are Raman spectra of the epitaxial $MoS_2$. With an increase in the number of layers, the $E^1_{2g}$ and $A_{1g}$ modes had a color displacement to red and blue, respectively. The ΔK value was 18.8 $cm^{-1}$, 22.6 $cm^{-1}$, 23.6 $cm^{-1}$, 24.5 $cm^{-1}$, and 25 3 $cm^{-1}$ for the $MoS_2$ monolayer, bilayer, trilayer, quadlayer, and pentalayer, respectively. FIG. 11D is a photoluminescence spectrum of epitaxial $MoS_2$. Two predominant absorption peaks (near 670 nm and 620 nm) identical to the two direct excitonic transitions (A1 and B1) appeared, and their intensity decreased with an increase in the number of layers. The indirect band gap transition was not observed in the epitaxial sample, which is common to the $SiO_2$ substrate.

<3-2: Wafer-Scale Growth>

FIG. 10A is an image of the $MoS_2$ monolayer grown on a 4"-wide $SiO_2$/Si wafer. The uniformity of the grown $MoS_2$ was evaluated by the ellipsometry mapping analysis [FIG. 10B]. The thickness was 0.7 to 0.8 nm. The growth was done successfully over the 3"-wide domain. In FIG. 10B, the unit of the inserted value is nanometer.

Figure 12A:
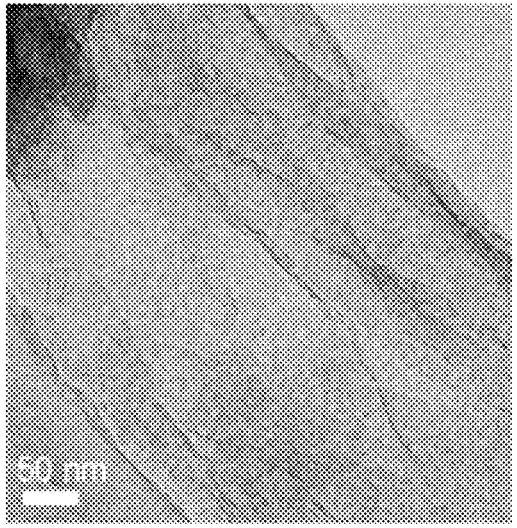
Figure 12B:
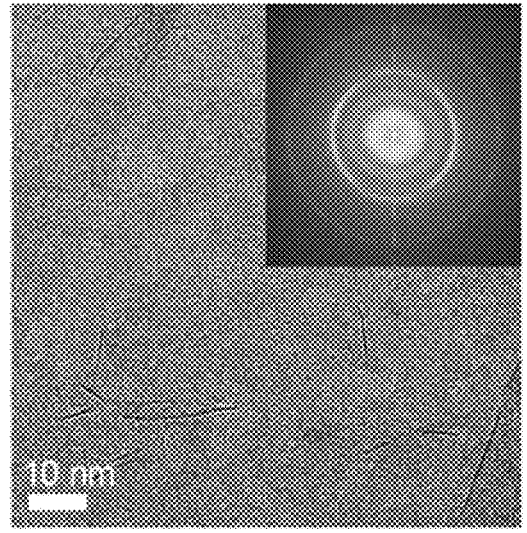
Figure 12C:
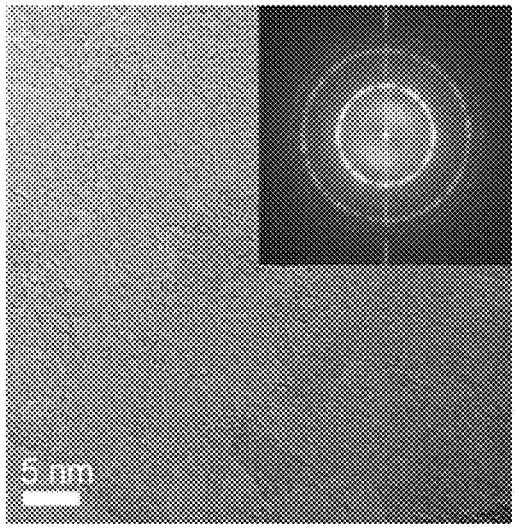
Figure 12D:
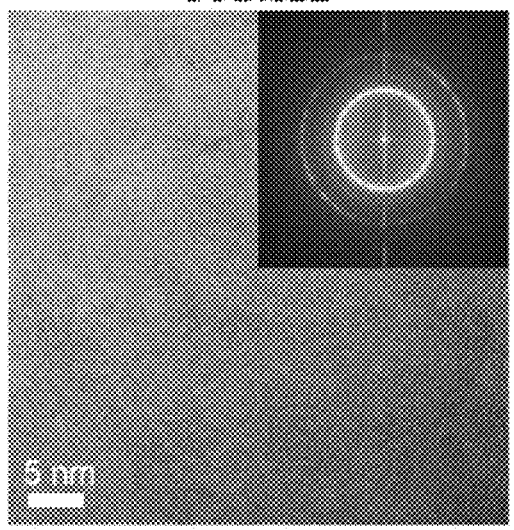
Figure 13C:
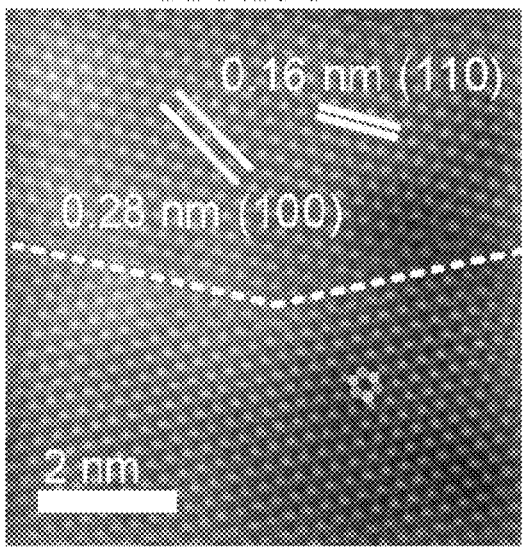
Figure 13D:
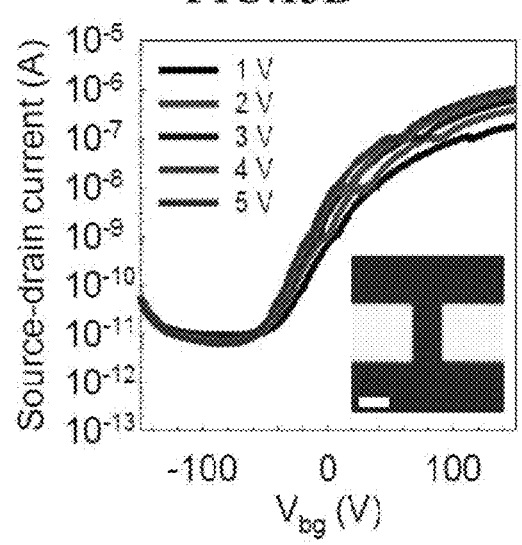

Example 4: Measurement of Electrical Performance of Transition Metal Dichalcogenide FIG. 12A is a low-magnification HRTEM image of the transferred three-dimensional $MoS_2$ [case 1 of FIG. 1A]. FIGS. 12B, 12C and 12D are high-magnification images chosen at an unselective position in FIG. 12A. The epitaxial polycrystalline $MoS_2$ consists of domains having a small-sized epitaxial structure, and the grain boundary is not distinguishable due to interference of overlapping layers and a small grain size. FIG. 13A is a low-magnification STEM-HAADF image of the polycrystalline $MoS_2$ monolayer. A triangular single domain having an approximate size of 100 nm is observed, with a grain boundary (yellow dotted triangle) produced. FIG. 13B is a high-magnification STEM-HAADF image of the grain boundary. Two adjacent monocrystalline domains form a grain boundary having an angle of inclination of 31°. The inserted diagram represents the FFT pattern showing the hexagonal structure of the $MoS_2$ monolayer. FIG. 13C is an equalized and Fourier-filtered image of FIG. 13B. A highly uniform indefective structure is observed for the lighter Mo atoms and the darker S atoms. FIG. 13D shows the electrical characteristic of the FET device manufactured to have channel length and width of 5 μm and 10 μm, respectively (inserted diagram, scale bar: 5 μm). The mobility of 0.15 $cm^2V^{-1}S^{-1}$ and the maximum on/off ratio of $10^5$ at 5 V were measured at the applied back-gate voltage of −150 V to 150 V. The monolayer of $MoS_2$ was not patterned.

It is known that the CVD process using a transition-metal-containing precursor, $Mo(CO)_6$, has the tendency to form large aggregates, Mo-based three-dimensional films, and films containing a considerable amount of carbides or oxides, such as $Mo_2C$ or MoOC, according to the deposition condition. Despite many demerits resulting from the carbonyl (CO) ligands released from the central Mo atom, the lower deposition temperature (FIGS. 1A and 1B) makes the precursor $Mo(CO)_6$ eligible for the low temperature growth. In order to achieve the two-dimensional growth of the epitaxial $MoS_2$ at 350° C., the inventors of the present invention have exploited a novel method to control the cluster size by using an accurate amount of the Mo precursor and to control the nucleation site on the $SiO_2$ substrate by high-vacuum annealing. Even though a large amount of a carrier gas (e.g., Ar or $H_2$) makes the decarbonylation easier according to the conventional studies, a large amount of a carrier gas leads to an increase in the absolute amount of the precursor vapor. Therefore, the use of a carrier gas is excluded in the present invention. In order to investigate the strategic approach of the present invention, the experiments were performed at varying $P_{SR}/P_{MoP}$ values. The $P_{MoP}$ was precisely controlled with a cooler-heater unit connected to a precursor canister [FIG. 2A]. The growth was performed with a showerhead type reactor for the sake of helping the formation of a uniform flow [FIG. 2B]. Prior to the growth, the $SiO_2$ substrate was pre-cleaned with acetone, isopropyl alcohol (IPA), and deionized water (DI) in order to prevent the occurrence of nucleation in the vicinity of the dust grain. Subsequently, for prevention of any surface contamination, the substrate was loaded in a load-lock chamber for several seconds under the atmospheric conditions, transferred to a main reactor and then grown at a substrate temperature of 350° C. for a predetermined time at varying $Mo(CO)_6$ sublimation temperatures (0 to 80° C.) and $H_2S$ flow rates (10 to 100 sccm). According to a preliminary experiment of the present invention performed at the lower $P_{SR}/P_{MoP}$ value, there was a structural change of $MoS_2$ dependent upon the cluster size, and the partial pressure ratio was a critical parameter to the two-dimensional growth [FIG. 3A]. FIG. 6A presents the atomic force microscopic (AFM) images of different samples grown at varying $P_{SR}/P_{MoP}$ values. At the lower $P_{SR}/P_{MoP}$ value (in cases 1 and 2), an irregular three-dimensional domain having a small grain size was grown. With an increase in the $P_{SR}/P_{MoP}$ value (in case 3), the morphology changed into a composite structure consisting of an irregular three-dimensional domain (island) and a two-dimensional triangular domain. At the far higher $P_{SR}/P_{MoP}$ value, the structure was completely changed to a two-dimensional triangular domain having a larger grain size (in case 4). Such a structural change can be explained by a hypothetical low temperature growth mechanism for the cluster-size-controlled growth [FIGS. 6B and 6C]. At a low $P_{SR}/P_{MoP}$ value, a large amount of $Mo(CO)_6$ vapor was sublimated and a large-sized $MoS_2$ cluster was created by the gas phase reaction. As a result, the created cluster was adsorbed on the surface of the substrate to grow a three-dimensional $MoS_2$ domain [FIG. 6B]. At a high $P_{SR}/P_{MoP}$ value, a pseudo two-dimensional $MoS_2$ domain was grown on the surface through desorption of volatile byproducts and changed into a $MoS_2$ monolayer through the surface diffusion [FIG. 6C]. The results of the Raman spectroscopic analysis of the grown $MoS_2$ coinsided those of the corresponding atomic structure measurement [FIG. 6D]. The difference (Δk) between the two Raman modes resulting from in-plane vibration $E^1{}_{2g}$ and out-of-plane vibration $A_{1g}$ was 21.7 cm$^{-1}$ for the $MoS_2$ grown at a low $P_{SR}/P_{MoP}$ value (in cases 1, 2 and 3) due to the coincidence of monolayer and bilayer $MoS_2$. At a high $P_{SR}/P_{MoP}$ value (in case 4), the Δk value was further reduced to 18.8 cm$^{-1}$ together with a decrease at the full width at half maximum (FWHM) in the $E^1{}_{2g}$ mode [FIG. 6E] and an increase of the photoluminescence [FIG. 6F]. These results show that the high-quality epitaxial $MoS_2$ can be grown at high $P_{SR}/P_{MoP}$. The formation of the two-dimensional domain is investigated by the theoretical consideration of the chemical potential and the surface energy. According to a study by Schweiger et al., the type of the edge-terminal (Mo- or S-edge) and the coverage by the sulfur atom of the monolayer $MoS_2$ cluster are affected by the relation with the counter parameters, such as the chemical potential of sulfur and the S-to-Mo ratio (FIG. 4) [Schweiger, H., Raybaud, P., Kresse, G. & Toulhoat, H. Shape and edge sites modifications of $MoS_2$ catalytic nanoparticles induced by working conditions: A theoretical study. J. Catal. 207, 76-87 (2002)]. Under the highly sulfiding condition (high $H_2S$ partial pressure), the low chemical potential of sulfur led to the 100% coverage of the Mo edge (or S edge) by 100% sulfur having the lowest surface energy. Under such conditions, the layer atoms were strongly attracted by the substrate to make the two-dimensional growth easier. According to an X-ray photoelectron spectroscopic (XPS) analysis on the $MoS_2$ grown at low to high $P_{SR}/P_{MoP}$ values, the S-to-Mo ratio measurements were 1.37, 1.99, 1.95, and 2.27 [FIGS. 6G and 6H]. These observation results explained the structural change and demonstrated that the cluster size and the highly sulfiding condition were critical factors in the epitaxial growth of $MoS_2$ at low temperatures.

The grain size of the polycrystalline two-dimensional material was the most important characteristic determining the physical and electrical properties of the polycrystalline two-dimensional material. The grain size of the two-dimensional material at low temperature was far smaller than that at high temperature. The inventors of the present invention observed the growth of a monocrystalline $MoS_2$ domain grown at varying $P_{SR}/P_{MoP}$ values according to the AFM method. But, a grain size of 50 nm or greater was not observed even under the highly sulfiding condition ($P_{SR}/P_{MoP}$=594). This experiment demonstrated the existence of the grain size restraint at 35° C. In order to overcome such a limitation resulting from the short diffusion length on the surface, the nucleation site was artificially manipulated by annealing the substrate under high vacuum. To investigate the effect of the nucleation-site manipulation on the grain size, the inventors of the present invention grew a monolayer $MoS_2$ on three different substrates, a $SiO_2$ substrate treated with a piranha solution ($H_2SO_4$:$H_2O_2$=3:1), a bare $SiO_2$, and a high-vacuum annealed $SiO_2$, as shown in FIG. 8. The domains having a larger grain size were created less on the vacuum-annealed $SiO_2$ substrate [FIG. 8C] than on the bare $SiO_2$ substrate [FIG. 8B]. In contrast, the triangular $MoS_2$ domains having a smaller grain size were formed more on the piranha-treated $SiO_2$ substrate [FIG. 8A] than on the bare $SiO_2$ substrate. It is known that the hydroxylated or hydrogen-passivated dangling bonds of amorphous $SiO_2$ provide more reactive surface sites than the unsaturated surface. In contrast, the high-vacuum annealing treatment decomposes the hydrogen-passivated dangling bonds. In the investigation of the nucleation and nucleation mechanisms on different substrates, the AFM images taken at different growth times show that the $MoS_2$ nuclei occupied all the desirable nucleation sites during the early phase of the growth and adhered to the edge of the grown monolayer domain, and another occurrence of nucleation did not take place during the growth (FIG. 7). The monolayer $MoS_2$ domain was grown to 100 nm on the nucleation-site-restrained substrate. The control of the affinity between nuclei and the substrate is important for the growth of high-quality $MoS_2$ at low temperature, and accordingly the problem of grain-size restraint can be overcome.

Conventionally, the number of the prepared two-dimensional transition metal dichalcogenide ($MoS_2$) layers has been controlled through the control of the thickness of the pre-deposited Mo, the surface energy, or supersaturation. The grown $MoS_2$ using the method of the present invention had the features of the epitaxial growth [Detailed growth process is shown in FIGS. 9A to 9F]. The different surface colors for different numbers of layers are shown in FIGS. 11A to 11D. In FIG. 11A, a very uniform large-area $MoS_2$ was grown on a 1×1 cm$^2$ $SiO_2$ substrate. As demonstrated from an ellipsometry mapping analysis, the $MoS_2$ was grown on a wafer scaled up to a size of 3" (FIGS. 10A and 10B). In addition, the Raman spectrometry and the photoluminescence measurement were used to evaluate the thickness of the grown $MoS_2$. The Raman spectrum of each sample shows the red and blue color displacements of $E^1{}_{2g}$ and $A_{1g}$, respectively, with an increase in the number of the layers [FIG. 11B]. The Δk measurements were 18.8 cm$^{-1}$, 22.6 cm$^{-1}$, 23.6 cm$^{-1}$, 24.5 cm$^{-1}$, and 25 cm$^{-1}$ for monolayer, bilayer, trilayer, quadlayer, and pentalayer, respectively. The two predominant absorption peaks (near 670 nm and 620 corresponded to the two direct excitonic transitions (A1 and B1), which was in agreement with the prior report. The control method of the present invention provides a method suitable for the epitaxial growth of $MoS_2$ on the wafer scale.

The atomic structure of the grown monolayer $MoS_2$ was evaluated using the high-angle annular dark-field (HAADF) imaging by the aberration-corrected scanning transmission electron microscopy (Cs-STEM). FIG. 13A is a low-magnification STEM-HAADF image of the $MoS_2$ monolayer transferred on a carbon grid through the conventional wet etching method. The white region indicates the coinciding $MoS_2$ monolayer during the transfer, and the gray region indicates the polycrystalline $MoS_2$ monolayer. The approximate size of the domain represented by the yellow dotted triangle was 100 nm, which was in agreement with the prior observation using AFM [FIG. 9B]. The high-magnification HAADF image of a selected region shows the atomic structure of the grain boundary by the two triangle domains [FIG. 13B]. In the inserted diagram of FIG. 13B, the fast Fourier transform (FFT) pattern shows the hexagonal structure of two monocrystalline $MoS_2$ domains having an angle of inclination of 31°. From the image reformed by equalization and Fourier filtering [FIG. 13C], a uniform monocrystalline $MoS_2$ domain was observed, and the creation of the monocrystalline $MoS_2$ domain was found through merging forming the grain boundary. The sample grown at higher $P_{SR}/P_{MoP}$ value had the higher quality than that grown at lower $P_{SR}/P_{MoP}$ value [FIGS. 12A to 12D]. Such a microscopic observation shows that a very uniform polycrystalline $MoS_2$ monolayer having a large grain size can grow even at 350° C. Further, the domain structure and the grain boundary were very similar to those of the $MoS_2$ grown at the higher temperature. In order to investigate the electrical performance, the monolayer $MoS_2$ grown at low temperature was used to manufacture a back-gate FET device. The device was prepared using a $MoS_2$ monolayer without patterning, and the channel length and width were 5 μm and 10 μm, respectively [the inserted diagram of FIG. 13D]. The $MoS_2$ monolayer was not treated after the growth, and the measurements were acquired at the room temperature under the atmospheric conditions. The FET device displayed the behavior of the conventional n-type semiconductor having a mobility of 0.15 $cm^2V^{-1}S^{-1}$ [FIG. 13D]. The maximum on/off ratio was $10^5$ in the gate voltage range of −150 V to 150 V using a source-drain bias voltage of 5 V.

As a result, the inventors of the present invention have developed a novel method for the epitaxial growth of a high-quality two-dimensional transition metal dichalcogenide at low temperature of 350° C. using a transition-metal-containing precursor, $Mo(CO)_6$, by controlling the cluster size and the nucleation site. The structural transition from the three-dimensional cluster to the second-dimensional monolayer was demonstrated through the control of the grain size using the variation of $P_{SR}/P_{MoP}$ and the restrained nucleation site. These two parameters are the key factor for the low temperature growth of large-grained $MoS_2$ with high electrical performance. The low temperature growth of the second-dimensional material, represented by graphene and transition metal dichalcogenide, is critical to the application of next-generation flexible and wearable devices. Accordingly, the results of the present invention suggest a novel approach to the manufacture of high-quality two-dimensional materials under low temperature conditions.

Example 5: Substrate Surface Treatment and Precursor-Decomposition-Accelerating Catalyst Treatment Highly doped (<0.005 Ω·cm) p-type Si with a $SiO_2$ layer having a thickness of 300 nm was used as a substrate. The substrate was pre-cleaned and, in a short time, placed on a silicon carbide (SiC)-coated susceptor in a load-lock chamber for the prevention of any contamination from the surrounding environments. Then, the substrate was subjected to a surface treatment using a potassium hydroxide solution to reduce the surface energy of the substrate. Subsequently, $H_2S$ as a chalcogen-containing precursor, $Mo(CO)_6$ (=99.9%, Sigma Aldrich, CAS number 13939-0605) as a transition-metal-containing precursor, $H_2$ gas as a precursor-decomposition-accelerating catalyst, and $H_2O$ as an inhibitor for preventing the creation of a two-dimensional transition metal dichalcogenide bilayer were introduced into the chamber to synthesize a $MoS_2$ thin film as a two-dimensional transition metal dichalcogenide thin film, in a showerhead type reactor according to the chemical vapor deposition (CVD) method. The heating block in the CVD was preheated to 250° C. prior to the growth. The susceptor with the substrate was transferred to the reactor, and the temperature of the substrate was raised for 10 minutes in the stream of argon (Ar). The synthesis was performed merely using $H_2S$, $Mo(CO)_6$, $H_2$, and $H_2O$ at a constant pressure (e.g., 3.0 Torr) for a synthesis time. After completion of the synthesis, the substrate was transferred to the load-lock chamber and cooled down in the stream of argon (100 sccm) for one hour. The treatment after the synthesis was not performed by known methods (e.g., Ar and $H_2S$ annealing at high temperature).

Comparative Example 1

The procedures were performed in the same manner as described in Example 5 to synthesize a $MoS_2$ thin film as a two-dimensional transition metal dichalcogenide thin film, excepting that $H_2$ gas as a precursor-decomposition-accelerating catalyst was not introduced into the deposition chamber.

Comparative Example 2

The procedures were performed in the same manner as described in Example 5 to synthesize a $MoS_2$ thin film as a two-dimensional transition metal dichalcogenide thin film, excepting that $H_2O$ as an inhibitor for preventing the creation of a two-dimensional transition metal dichalcogenide bilayer was not introduced into the deposition chamber.

Example 6: Increase of $MoS_2$ Crystal Size

Highly doped (<0.005 Ω·cm) p-type Si with a $SiO_2$ layer having a thickness of 300 nm was used as a substrate. The substrate was pre-cleaned and, in a short time, placed on a silicon carbide (SiC)-coated susceptor in a load-lock chamber for the prevention of any contamination from the surrounding environments. Then, the substrate was subjected to a surface treatment using a potassium hydroxide solution to reduce the surface energy of the substrate. Subsequently, $H_2S$ as a chalcogen-containing precursor, $Mo(CO)_6$ (=99.9%, Sigma Aldrich, CAS number 13939-0605) as a transition-metal-containing precursor, $H_2$ gas as a precursor-decomposition-accelerating catalyst, and $H_2O$ as an inhibitor for preventing the creation of a two-dimensional transition metal dichalcogenide bilayer were introduced into the chamber at a constant pressure of 3.0 Torr for a constant period of time to create crystals of $MoS_2$ on the substrate by the chemical vapor deposition (CVD) method. Further, $H_2S$, $Mo(CO)_6$, $H_2$, and $H_2O$ were introduced into the chamber at a constant pressure of at least 9 Torr (e.g., 12 Torr) for a constant period of time to form a two-dimensional transition metal dichalcogenide monolayer on the substrate and thereby to synthesize a $MoS_2$ thin film as a two-dimensional transition metal dichalcogenide thin film. The heating block in the CVD was preheated to 250° C. prior to the growth. The susceptor with the substrate was transferred to the reactor, and the temperature of the substrate was raised for 10 minutes in the stream of argon (Ar). After completion of the synthesis, the substrate was transferred to the load-lock chamber and cooled down in the stream of argon (100 sccm) for one hour. The treatment after the synthesis was not performed by known methods (e.g., Ar and $H_2S$ annealing at high temperature).

For evaluation of the effect of a precursor-decomposition-accelerating catalyst, the synthesis results of the $MoS_2$ thin film of Example 5 using $H_2$ gas as a precursor-decomposition-accelerating catalyst are shown in the microscopic image of FIG. 16A, and those of the $MoS_2$ thin film of Comparative Example 1 not using $H_2$ gas are shown in the microscopic image of FIG. 16B.

According to a comparison between FIGS. 16A and 16B, the synthesis of a two-dimensional transition metal dichalcogenide thin film without a precursor-decomposition-accelerating catalyst took a synthesis time of 9 hours in total (Refer to FIG. 16B), while the synthesis of a two-dimensional transition metal dichalcogenide thin film with $H_2$ as a precursor-decomposition-accelerating catalyst took a synthesis time of 2 hours in total (Refer to FIG. 16A). This shows that the use of the precursor-decomposition-accelerating catalyst made the synthesis rate of the two-dimensional transition metal dichalcogenide thin film 4.5 times faster.

For evaluation of the effect of an inhibitor for preventing the creation of a two-dimensional transition metal dichalcogenide bilayer, the synthesis results of the $MoS_2$ thin film of Example 5 using $H_2O$ as the inhibitor are shown in the microscopic image of FIG. 19A, and those of the $MoS_2$ thin film of Comparative Example 1 not using $H_2O$ are shown in the microscopic image of FIG. 19B.

According to a comparison between FIGS. 19A and 19B, the synthesis of a two-dimensional transition metal dichalcogenide thin film using $H_2O$ as an inhibitor created mostly a two-dimensional transition metal dichalcogenide monolayer (in gray) and scarcely a two-dimensional transition metal dichalcogenide bilayer (in black) in the step of deposition at low temperature (e.g., 500° C. or below) to form a uniform two-dimensional transition metal dichalcogenide thin film (Refer to FIG. 19A), whereas the synthesis of a two-dimensional transition metal dichalcogenide thin film without using $H_2O$ as an inhibitor created a two-dimensional transition metal dichalcogenide monolayer (in gray) and plenty of two-dimensional transition metal dichalcogenide bilayers (in black) in a simultaneous manner in the step of deposition at low temperature (e.g., 500° C. or below) to form a non-uniform two-dimensional transition metal dichalcogenide thin film (Refer to FIG. 19B).

As shown in FIG. 21, the synthesis of a $MoS_2$ thin film according to Example 6 resulted in the formation of a highly uniform polycrystalline $MoS_2$ thin film with enhanced uniformity.

The present invention has been described with reference to the particular preferred embodiments. The scope of the present invention is not limited to the specific embodiments disclosed as the best modes planned to realize the present invention but includes many changes and modifications made by those skilled in the art without departing from the scope and spirit of the present invention.

What is claimed is:

1. A method for preparing a two-dimensional transition metal dichalcogenide, comprising:
   pre-treating a substrate in a deposition chamber; and
   introducing a chalcogen-containing precursor and a transition-metal-containing precursor into the deposition chamber to deposit a two-dimensional transition metal dichalcogenide on the substrate,
   wherein the deposition step includes further adding an inhibitor for preventing the creation of a two-dimensional transition metal dichalcogenide bilayer.

2. The method as claimed in claim 1, wherein the transition-metal-containing precursor comprises a transition metal selected from the group consisting of Ti, V, Cr, Mn, Fe, Co, Ni, Cu, Zn, Nb, Ta, Mo, W, Tc, Re, Ru, Os, Rh, Ir, Pt, Ag, Au, Cd, In, Tl, Sn, Pb, Sb, Bi, Zr, Te, Pd, Hf, and a combination thereof.

3. The method as claimed in claim 1, wherein a partial pressure ratio of the chalcogen-containing precursor to the transition-metal-containing precursor is 1:2 or greater.

4. The method as claimed in claim 1, wherein the chalcogen-containing precursor comprises an S-containing organic compound or an S-containing inorganic compound.

5. The method as claimed in claim 1, wherein the deposition is performed at a low temperature of 600° C. or below.

6. The method as claimed in claim 1, wherein the deposition is performed according to a chemical vapor deposition method.

7. The method as claimed in claim 6, wherein the chemical vapor deposition method comprises low pressure chemical vapor deposition, atmospheric pressure chemical vapor deposition, metal organic chemical vapor deposition, plasma-enhanced chemical vapor deposition, inductively coupled plasma chemical vapor deposition, atomic-layer chemical vapor deposition, or plasma-enhanced atomic layer deposition.

8. The method as claimed in claim 1, wherein the pretreatment of the substrate is performed to control a nucleation site of the transition metal dichalcogenide to be deposited on the substrate.

9. The method as claimed in claim 1, wherein a partial pressure ratio of the chalcogen-containing precursor to the transition-metal-containing precursor is adjusted to control a surface energy and the size of a cluster formed by gas phase reaction during the deposition process of the transition metal dichalcogenide, thereby inducing a two-dimensional growth of the transition metal dichalcogenide.

10. The method as claimed in claim 1, wherein in the deposition process, the internal pressure of the deposition chamber is adjusted to control the amounts of the chalcogen-containing precursor and the transition-metal-containing precursor to be introduced into the deposition chamber, thereby controlling a partial pressure ratio of the chalcogen-containing precursor to the transition-metal-containing precursor.

11. A method for preparing a two-dimensional transition metal dichalcogenide thin film, comprising:
   performing a surface treatment on a substrate in a deposition chamber to reduce the surface energy of the substrate; and
   introducing a chalcogen-containing precursor, a transition-metal-containing precursor, and a precursor-decomposition-accelerating catalyst into the deposition chamber to deposit a two-dimensional transition metal dichalcogenide monolayer on the substrate,
   wherein the deposition step includes further adding an inhibitor for preventing the creation of a two-dimensional transition metal dichalcogenide bilayer.

12. The method as claimed in claim 11, wherein the inhibitor has an adsorption energy higher on the edge planes of the substrate and the transition metal dichalcogenide monolayer rather than on the basal plane of the two-dimensional transition metal dichalcogenide monolayer,
   wherein the chalcogen has an adsorption energy higher on the basal planes of the substrate and the transition metal dichalcogenide monolayer than on the edge plane of the transition metal dichalcogenide monolayer.

13. The method as claimed in claim 11, wherein the precursor-decomposition-accelerating catalyst speeds up the decomposition of the chalcogen-containing precursor to take the ligand off from the chalcogen atom in the chalcogen-containing precursor, and/or the decomposition of the transition-metal-containing precursor containing a ligand bonded to a transition metal atom to take the ligand off from the transition metal atom in the transition-metal-containing precursor.

14. The method as claimed in claim 11, wherein the surface treatment of the substrate is performed by a wet surface treatment method selected from the group consisting of piranha solution treatment, sulfuric acid ($H_2SO_4$) solution treatment, hydrochloric acid (HCl) solution treatment, and alkali metal hydroxide solution treatment; or a dry surface treatment method selected from the group consisting of $O_2$ plasma thermal treatment and water vapor thermal treatment.

15. The method as claimed in claim 11, wherein the substrate is selected from the group consisting of $SiO_2$, $Al_2O_3$, $HfO_2$, $LiAlO_3$, MgO, Si, Ge, GaN, AlN, GaP, InP, GaAs, SiC, glass, quartz, sapphire, graphite, graphene, plastic, polymer, boron nitride (h-BN), and a combination thereof.

16. The method as claimed in claim 11, wherein the substrate is selected from the group consisting of $SiO_2$, $Al_2O_3$, $HfO_2$, $LiAlO_3$, MgO, and a combination thereof,
wherein the surface treatment of the substrate is performed by a wet surface treatment method selected from the group consisting of piranha solution treatment, sulfuric acid ($H_2SO_4$) solution treatment, hydrochloric acid (HCl) solution treatment, and alkali metal hydroxide solution treatment; or a dry surface treatment method selected from the group consisting of $O_2$ plasma thermal treatment and water vapor thermal treatment.

17. The method as claimed in claim 11, wherein a partial pressure ratio of the chalcogen-containing precursor to the transition-metal-containing precursor is at least 2.

18. A method for preparing a two-dimensional transition metal dichalcogenide thin film, comprising:

(1) performing a surface treatment on a substrate in a deposition chamber to reduce the surface energy of the substrate;

(2) introducing a chalcogen-containing precursor and a transition-metal-containing precursor into the deposition chamber at a temperature of 500° C. or below and a first pressure of 0.001 to 760 Torr to create crystals of the two-dimensional transition metal dichalcogenide on the substrate;

(3) introducing the chalcogen-containing precursor and the transition-metal-containing precursor into the deposition chamber at a second pressure higher than the first pressure of the step (2) to increase the crystal size of the two-dimensional transition metal dichalcogenide on the substrate; and (4) introducing the chalcogen-containing precursor and the transition-metal-containing precursor into the deposition chamber at a third pressure higher than the second pressure of the step (3) to form a two-dimensional transition metal dichalcogenide monolayer on the substrate, wherein an inhibitor for preventing the creation of a two-dimensional transition metal dichalcogenide bilayer is further added into the deposition chamber in the steps (2), (3) and (4).

19. The method as claimed in claim 18, wherein a precursor-decomposition-accelerating catalyst is further added into the deposition chamber in the steps (2), (3) and (4).

* * * * *